(12) United States Patent
Kobayashi et al.

(10) Patent No.: US 8,817,527 B2
(45) Date of Patent: Aug. 26, 2014

(54) SEMICONDUCTOR DEVICE

(75) Inventors: Hidetomo Kobayashi, Kanagawa (JP); Masashi Fujita, Tokyo (JP); Takuro Ohmaru, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 281 days.

(21) Appl. No.: 13/467,097

(22) Filed: May 9, 2012

(65) Prior Publication Data

US 2012/0287703 A1  Nov. 15, 2012

(30) Foreign Application Priority Data

May 13, 2011  (JP) ................................. 2011-108623

(51) Int. Cl.
*G11C 11/00* (2006.01)
*G06F 12/08* (2006.01)

(52) U.S. Cl.
CPC ...................................... *G06F 12/08* (2013.01)
USPC .......................................... 365/154; 365/149

(58) Field of Classification Search
CPC ....................................................... G06F 12/08
USPC ................................................. 365/154, 149
See application file for complete search history.

(56) References Cited

U.S. PATENT DOCUMENTS

| | | | |
|---|---|---|---|
| 5,528,032 A | 6/1996 | Uchiyama | |
| 5,687,382 A * | 11/1997 | Kojima et al. | 713/320 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Vu Le
(74) *Attorney, Agent, or Firm* — Fish & Richardson P.C.

(57) ABSTRACT

When a CPU provided with a latch memory is operated, a constant storage method or an end storage method is selected depending on what is processed by the CPU; thus, the CPU provided with a latch memory has low power consumption. When the CPU provided with a latch memory is operated, in the case where the number of times of turning on and off the power source is high, a constant storage method is employed and in the case where the number of times of turning on and off the power source is low, an end storage method is employed. Whether a constant storage method or an end storage method is selected is determined based on the threshold value set depending on power consumption.

18 Claims, 19 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,982,512 B2 * | 7/2011 | Misawa et al. ............. 327/175 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101332 A1 | 5/2011 | Yamazaki et al. |
| 2011/0101351 A1 | 5/2011 | Yamazaki |
| 2011/0121878 A1 | 5/2011 | Kato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-050208 A | 2/2006 |
| JP | 2007-096055 A | 4/2007 |
| JP | 2007-123861 A | 5/2007 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel, YBFe2O4, and YB2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID

(56) References Cited

OTHER PUBLICATIONS

Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2012/061791, dated Jun. 5, 2012, 4 pages.

Written Opinion, PCT Application No. PCT/JP2012/061791, dated Jun. 5, 2012, 4 pages.

* cited by examiner

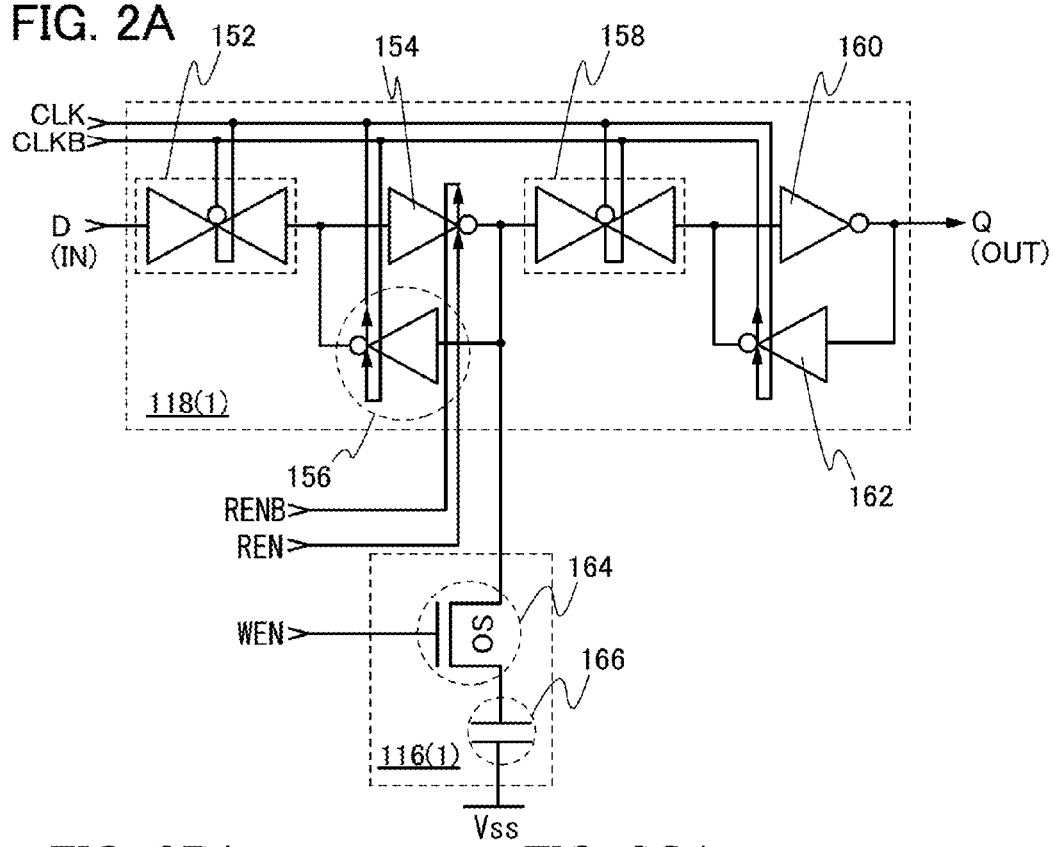
FIG. 2A
FIG. 2B1
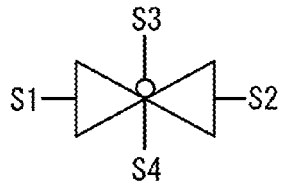
FIG. 2B2
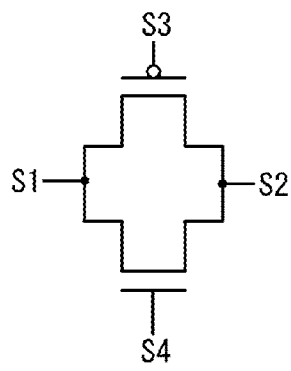
FIG. 2C1
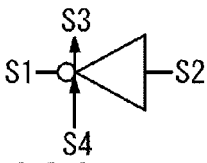
FIG. 2C2
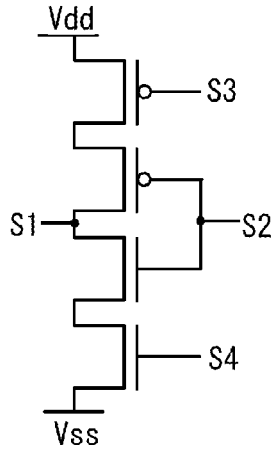

● In
☾ Sn
⌣ Zn
● O

● In
● Ga
● Zn
● O

SEMICONDUCTOR DEVICE

TECHNICAL FIELD

The present invention relates to a semiconductor device. In this specification, a semiconductor device refers to a semiconductor element itself or a device including a semiconductor element. As such a semiconductor element, a thin film transistor is given, for example. Accordingly, the semiconductor device includes liquid crystal display devices, memory devices, and the like.

BACKGROUND ART

A variety of devices (circuits) are mounted in a semiconductor device depending on its functions. As such devices (circuits), central processing units (CPUs) which process data can be given, for example. Low power consumption is required for CPUs.

In addition, a memory device which is used to process data is mounted on a CPU. As an example of such a memory device, a latch memory can be given.

On the other hand, in recent years, metal oxides having semiconductor characteristics (hereinafter, referred to as oxide semiconductors) have attracted attention. Oxide semiconductors can be applied to transistors (see Patent Documents 1 and 2).

REFERENCE

[Patent Document 1] Japanese Published Patent Application No. 2007-123861
[Patent Document 2] Japanese Published Patent Application No. 2007-096055

DISCLOSURE OF INVENTION

As examples of a method for storing data in a memory element included in a latch memory, a method for storing data in a memory element at every processing (hereinafter, referred to as a constant storage method) and a method for storing data in a memory element only at the end of processing (hereinafter, referred to as an end storage method) can be given.

In the constant storage method, access to memory elements is sequentially made and data is stored therein while a CPU performs arithmetic processing; therefore, the power can be turned off immediately. However, access to the memory elements is sequentially made, which leads to an increase in power consumed by writing and/or erasing in the memory element.

On the other hand, in the end storage method, access to memory elements is not made while a CPU performs arithmetic processing, so that power consumption can be low. However, all data is stored in memory elements only at the end of processing; therefore, it takes long to turn off the power as compared to the case of the constant storage method.

Note that such time required for turning off the power is called overhead. Although there is overhead also in the constant storage method, it is extremely short.

An object of one embodiment of the present invention is to reduce power consumption of a CPU provided with a latch memory by selecting a constant storage method or an end storage method depending on what is processed by the CPU when the CPU provided with a latch memory is operated.

One embodiment of the present invention is a method for operating a CPU in which when a CPU provided with a latch memory is operated, a constant storage method is employed in the case where the number of times of turning on and off the power is large and an end storage method is employed in the case where the number of times of turning on and off the power is small.

Here, the case where the number of times of turning on and off the power is large and the case where the number of times of turning on and off the power is small are sorted by the total of power consumption of storing and reading data in arithmetic processing. In other words, in the constant storage method, power consumed by charge and discharge of a memory element always occurs during processing; however, power consumed in overhead is low because the overhead time is short. On the other hand, in the end storage method, power consumed by charge and discharge of a memory element does not occur; however, power consumed in overhead is high because the overhead time is long. Therefore, a method by which the total of power consumed by charge and discharge of a memory element and power consumed in overhead is small is selected depending on what is processed by the CPU.

A constant storage method or an end storage method may be selected by a manufacturer or a user of a semiconductor device. A manufacturer may make a selection in the case where what is processed by the CPU is determined in advance, and a user may make a selection in the case where what is processed by the CPU is not determined in advance and a change is needed as appropriate depending on the structure and the operation of the semiconductor device provided with the CPU, or the like.

Alternatively, a constant storage method or an end storage method may be automatically selected by a CPU depending on the number of times of turning on and off the power which has been done.

One embodiment of the present invention is a semiconductor device including at least a control circuit and a central processing unit. The control circuit includes at least a monitor circuit, a signal control circuit, and a first memory element. The central processing unit includes at least a plurality of second memory elements and a plurality of flip-flop circuits. The monitor circuit counts the number of times of turning on and off the power. The signal control circuit generates a signal to be input to the plurality of second memory elements and the plurality of flip-flop circuits which are included in the central processing unit. In the case where the counted number is higher than or equal to the threshold value, data of a constant storage method is stored in the first memory element and in the case where the counted number is lower than the threshold value, data of an end storage method is stored in the first memory element. The plurality of second memory elements each include a capacitor of which one electrode is electrically connected to a wiring held at a constant potential and a transistor of which one of a source and a drain is electrically connected to the other electrode of the capacitor. The off-state current per micrometer in channel width of the transistor is less than or equal to 10 aA/μm.

The control circuit may include a timer and an interface. The central processing unit may include a logic circuit.

Note that in such a semiconductor device, a transistor with extremely small off-state current can be used as a memory element. In other words, a node which is set in a floating state is provided between one of a source and a drain of a transistor with extremely small off-state current and one electrode of a capacitor and the potential of the node is set to an H level or an L level, so that data can be held. The use of a transistor with extremely small off-state current allows data to be held even when the power is off In this specification, a transistor with extremely small off-state current means a transistor whose off-state current per micrometer in channel width at room temperature can be less than or equal to 10 aA/μm ($1\times10^{-17}$ A/μm), preferably less than or equal to 1 aA/μm ($1\times10^{-18}$ A/μm), more preferably less than or equal to 1 zA/μm ($1\times10^{-21}$ A/μm), still more preferably less than or equal to 1 yA/μm ($1\times10^{-24}$ A/μm).

The transistor with extremely small off-state current preferably includes a channel formation region formed using a semiconductor material with a wide bandgap (2.0 eV to 3.5 eV) and is preferably a transistor which can be regarded as having substantially no minority carriers (a transistor in which minority carriers do not substantially exist). As a semiconductor material used for such a transistor with extremely small off-state current, a compound semiconductor such as silicon carbide or gallium nitride, which has smaller intrinsic carrier density than silicon, or an oxide semiconductor such as zinc oxide can be used. For example, in a transistor with a channel formation region formed using an oxide semiconductor, the density of minority carriers is low and the minority carriers are difficult to induce. Therefore, in the transistor with a channel formation region formed using an oxide semiconductor, leakage current hardly occurs and the off-state current is small.

Note that in this specification, "atoms" or "molecules" may be ionized atoms or molecules.

According to one embodiment of the present invention, power consumption of a CPU provided with a latch memory can be reduced.

BRIEF DESCRIPTION OF DRAWINGS

In the accompanying drawings:

FIGS. 2A, 2B1, 2B2, 2C1, and 2C2 illustrate a portion 122 of a semiconductor device 100 in FIG. 1;

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

First, an example of a structure of a semiconductor device which is one embodiment of the present invention is described.

Figure 1:
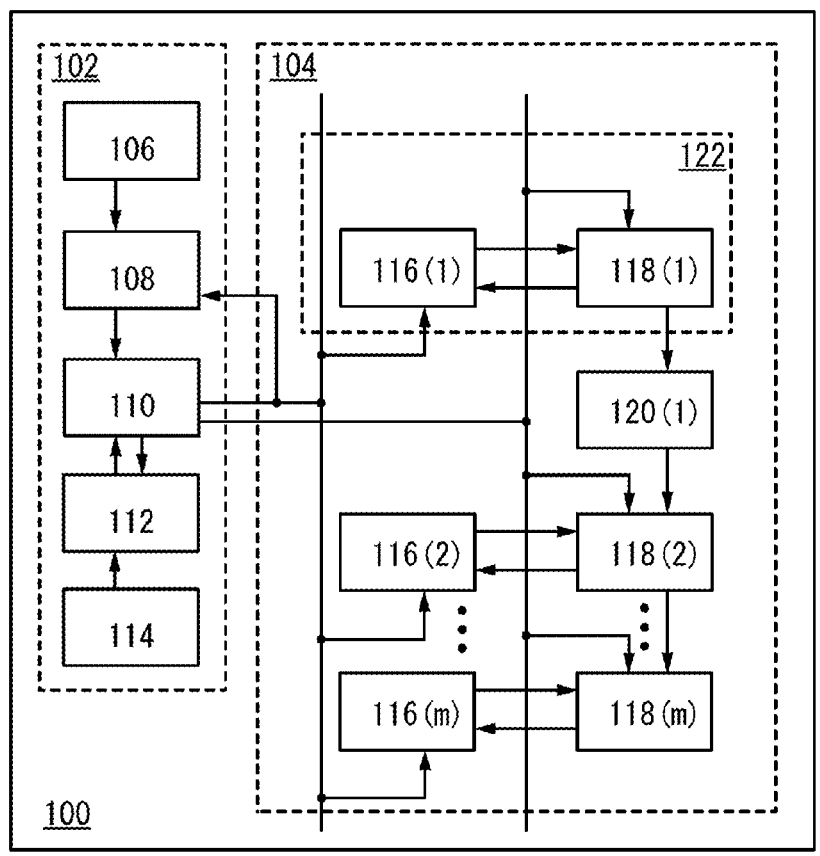
FIG. 1 schematically illustrates a semiconductor device according to one embodiment of the present invention.

FIG. 1 is a schematic diagram of a semiconductor device 100 which is one embodiment of the present invention. The semiconductor device 100 includes a control circuit 102 and a CPU 104. The control circuit 102 includes a timer 106, a monitor circuit 108, an EN signal control circuit 110, a method storage memory element 112, and an interface 114. The CPU 104 includes a data storage memory element 116, a flip-flop circuit 118, and a logic circuit 120.

Here, a plurality of data storage memory elements 116, a plurality of flip-flop circuits 118, and a plurality of logic circuits 120 are provided. As illustrated in FIG. 1, m (m is a natural number) data storage memory elements 116 and m flip-flop circuits 118 are provided. Note that the logic circuit 120 is provided between the flip-flop circuit 118(k) and the flip-flop circuit 118(k+1) (k is a natural number), and the logic circuits 120 are provided at random; for example, the logic circuit 120 is provided between the flip-flop circuit 118(k) and the flip-flop circuit 118(k+1), and the logic circuit 120 is not necessarily provided between the flip-flop circuit 118(k−1) and the flip-flop circuit 118(k). Therefore, n (n is a natural number, n<m) logic circuits 120 are provided.

The CPU 104 is a circuit which performs arithmetic processing.

The timer 106 sets a counting period of the monitor circuit 108.

The monitor circuit 108 is a circuit which counts the number of changes of an EN signal during a period set by the timer 106 (the number of changes of the EN signal from an H signal to an L signal and from an L signal to an H signal).

The EN signal control circuit 110 is a circuit which selects a constant storage method or an end storage method based on data of the method storage memory element 112 and generates and outputs an EN signal based on the selected method (an initial time). Alternatively, a constant storage method or an end storage method is selected based on the number of changes of an EN signal counted by the monitor circuit 108 (in operation). The threshold value of the number of changes of an EN signal (reference value) is a predetermined value depending on power consumption. In the case where the number of changes of an EN signal is higher than or equal to the threshold value, a constant storage method is employed, and in the case where the number of changes of an EN signal is lower than the threshold value, an end storage method is employed. The selected constant storage method or end storage method may be stored in the method storage memory element 112.

As an EN signal generated by the EN signal control circuit 110, there are a REN (read enable) signal and a WEN (write enable) signal. That is, when a signal is referred to as an EN signal, the signal includes both a REN signal and a WEN signal.

The method storage memory element 112 is an element which stores a method selected by the EN signal control circuit 110. The method storage memory element 112 is acceptable as long as it can store at least 1-bit data. This is because it is sufficient that the memory element stores either a selected constant storage method or end storage method.

The interface 114 is used for inputting either a constant storage method or an end storage method selected as an operation method of the semiconductor device 100 by a manufacturer, a user, or the like of the semiconductor device 100. A manufacturer may input a method through the interface 114 in the case where what is processed by the CPU 104 is determined in advance, and a user may input a method through the interface 114 in the case where what is processed by the CPU 104 is not determined in advance and a change is needed as appropriate depending on the structure and the operation of the semiconductor device 100, or the like.

The data storage memory element 116 stores data used for arithmetic processing or data calculated by arithmetic processing. All data storage memory elements 116 are electrically connected to the EN signal control circuit 110 and a WEN signal is input to the data storage memory elements 116.

As the flip-flop circuit 118, a D flip-flop circuit may be used. All flip-flop circuits 118 are electrically connected to the EN signal control circuit 110, and a REN signal and an inverted REN signal (RENB) are input to the flip-flop circuits 118.

The logic circuit 120 is a circuit used for arithmetic processing and is provided between two flip-flop circuits 118.

Here, description is made focusing on a portion 122 which is part of the CPU 104. Note that the portion 122 is provided with the data storage memory element 116(1) and the flip-flop circuit 118(1).

FIG. 2A shows a specific example of a circuit configuration of the portion 122. The portion 122 includes the data storage memory element 116(1) and the flip-flop circuit 118(1).

Here, the data storage memory element 116(1) includes a transistor 164 and a capacitor 166. One electrode of the capacitor 166 is electrically connected to a low potential power supply line (Vss) and the other electrode of the capacitor 166 is electrically connected to one of a source and a drain of the transistor 164, and the other of the source and the drain of the transistor 164 is electrically connected to the flip-flop circuit 118(1). Note that a gate of the transistor 164 is electrically connected to the EN signal control circuit 110, and a WEN signal is input to a gate of the transistor 164.

The flip-flop circuit 118(1) includes a first transmission gate 152, a first clocked inverter circuit 154, a second clocked inverter circuit 156, a second transmission gate 158, an inverter circuit 160, and a third clocked inverter circuit 162. An input terminal of the flip-flop circuit 118(1) is electrically connected to a first terminal of the first transmission gate 152. A second terminal of the first transmission gate 152 is electrically connected to a first terminal of the first clocked inverter circuit 154 and a second terminal of the second clocked inverter circuit 156. A second terminal of the first clocked inverter circuit 154 is electrically connected to a first terminal of the second clocked inverter circuit 156, a first terminal of the second transmission gate 158, and the other of the source and the drain of the transistor 164. A second terminal of the second transmission gate 158 is electrically connected to a first terminal of the inverter circuit 160 and a second terminal of the third clocked inverter circuit 162. A second terminal of the inverter circuit 160 and a first terminal of the third clocked inverter circuit 162 are electrically connected to an output terminal of the flip-flop circuit 118(1).

A clock signal (CLK) is input to a gate of an n-channel transistor of the first transmission gate 152, and an inverted clock signal (CLKB) is input to a gate of a p-channel transistor of the first transmission gate 152. A REN signal and a RENB signal are input to the first clocked inverter circuit 154. An inverted clock signal (CLKB) is input to a gate of an n-channel transistor of the second clocked inverter circuit 156, and a clock signal (CLK) is input to a gate of a p-channel transistor of the second clocked inverter circuit 156. An inverted clock signal (CLKB) is input to a gate of an n-channel transistor of the second transmission gate 158, and a clock signal (CLK) is input to a gate of a p-channel transistor of the second transmission gate 158. An inverted clock signal (CLKB) is input to a gate of an n-channel transistor of the third clocked inverter circuit 162, and a clock signal (CLK) is input to a gate of a p-channel transistor of the third clocked inverter circuit 162.

Here, examples of specific structures of circuits in FIG. 2A are illustrated in FIGS. 2B1, 2B2, 2C1, and 2C2.

A specific structure of a transmission gate in FIG. 2B1 is illustrated in FIG. 2B2. In FIG. 2B1, S1 to S4 correspond to S1 to S4 in FIG. 2B2, respectively.

A specific structure of a clocked inverter circuit in FIG. 2C1 is illustrated in FIG. 2C2. In FIG. 2C1, S1 to S4 correspond to S1 to S4 in FIG. 2C2, respectively.

Data can be held between the one of the source and the drain of the transistor 164 and the one electrode of the capacitor 166 because the off-state current of the transistor 164 is extremely small. As described above, when the power is turned off, data is stored in the data storage memory element 116, not in a non-volatile memory element outside the data storage memory element 116 and the flip-flop circuit 118; therefore, it does not take long time to store data and data can be held while the power is off.

Note that the transistor with extremely small off-state current means a transistor whose off-state current per micrometer in channel width at room temperature can be less than or equal to 10 aA/μm ($1\times10^{-17}$ A/μm), less than or equal to 1 aA/μm ($1\times10^{-18}$ A/μm), further less than or equal to 1 zA/μm ($1\times10^{-21}$ A/μm), still further less than or equal to 1 yA/μm ($1\times10^{-24}$ A/μm).

The transistor with extremely small off-state current preferably includes a channel formation region formed using a semiconductor material with a wide bandgap (2.0 eV to 3.5 eV) and is preferably a transistor which can be regarded as having substantially no minority carriers (a transistor in which minority carriers do not substantially exist). As a semiconductor material used for such a transistor with extremely small off-state current, a compound semiconductor such as silicon carbide or gallium nitride, which has smaller intrinsic carrier density than silicon, or an oxide semiconductor such as zinc oxide can be used. For example, in a transistor with a channel formation region formed using an oxide semiconductor, the density of minority carriers is low and the minority carriers are difficult to induce. Therefore, in the transistor with a channel formation region formed using an oxide semiconductor, leakage current hardly occurs and the off-state current is small.

As described above, the structures illustrated in FIG. 1 and FIG. 2A is employed and a transistor with extremely small off-state current is used, whereby leakage of charge from a memory holding portion can be prevented, and power consumption can be reduced.

Note that the flip-flop circuit 118(1) is not limited to the mode illustrated in FIG. 2A and may be a D flip-flop circuit.

As the above-described transistor 164, an oxide semiconductor transistor is preferably used.

Note that in the present invention, a transistor is not limited to that having a specific structure and can have a variety of structures. Thus, a transistor may be a transistor including polycrystalline silicon or a transistor formed using an SOI (silicon on insulator) substrate.

Note that in the above description, the transistor 164 is an n-channel transistor but is not limited thereto. A p-channel transistor may be used as appropriate.

Next, a transistor with small off-state current which can be applied to the present invention is described. An example of the transistor with small off-state current is a transistor including a metal oxide showing semiconductor characteristics. As a transistor other than a transistor with small off-state current, a transistor formed using a semiconductor substrate can be given.

Figure 3:
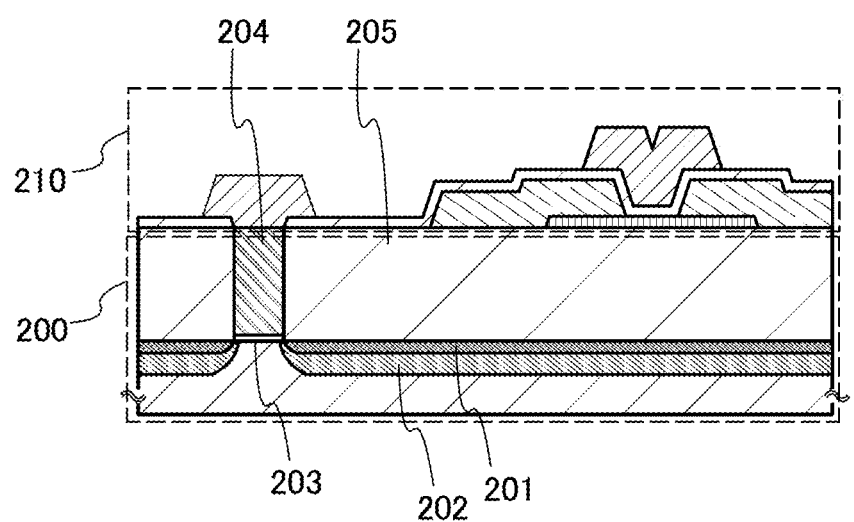
FIG. 3 is a schematic cross-sectional view of an applicable transistor.

FIG. 3 illustrates an example of a schematic cross-sectional structure of a transistor which can be applied to the present invention. In FIG. 3, a transistor with small off-state current is formed over a transistor formed using a semiconductor substrate. A transistor formed using a semiconductor substrate may include both of or only one of a p-channel transistor and an n-channel transistor.

The p-channel transistor and the n-channel transistor may be formed using the semiconductor substrate by a known method. After the p-channel transistor and the n-channel transistor are formed using the semiconductor substrate, the transistor with small off-state current is formed thereover. That is to say, the p-channel transistor and the n-channel transistor are formed using the semiconductor substrate 200 as a formation substrate, and then, the transistor with small off-state current is formed over the substrate. As an example of the transistor with small off-state current, there is a transistor having a channel formation region in an oxide semiconductor layer.

Note that the semiconductor substrate 200 provided with the p-channel transistor and the n-channel transistor includes a high-concentration impurity region 201 functioning as a source region or a drain region, a low-concentration impurity region 202, a gate insulating film 203, a gate electrode 204, and an interlayer insulating film 205 (FIG. 3).

Figure 4A:
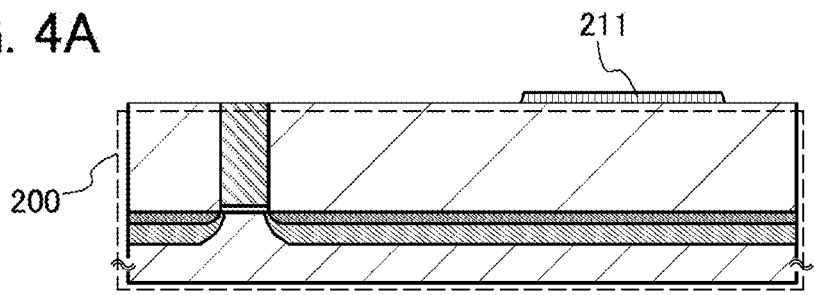
FIGS. 4A to 4D illustrate a method for manufacturing a transistor illustrated in FIG. 3.
Figure 4B:
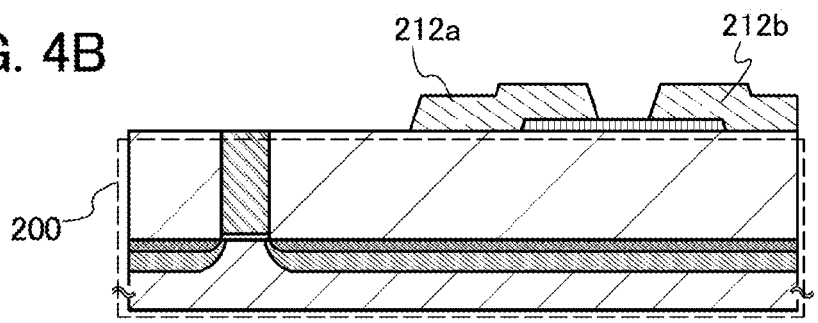
Figure 4C:
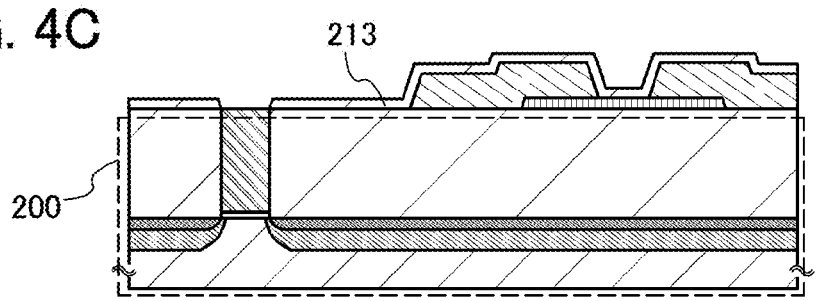
Figure 4D:
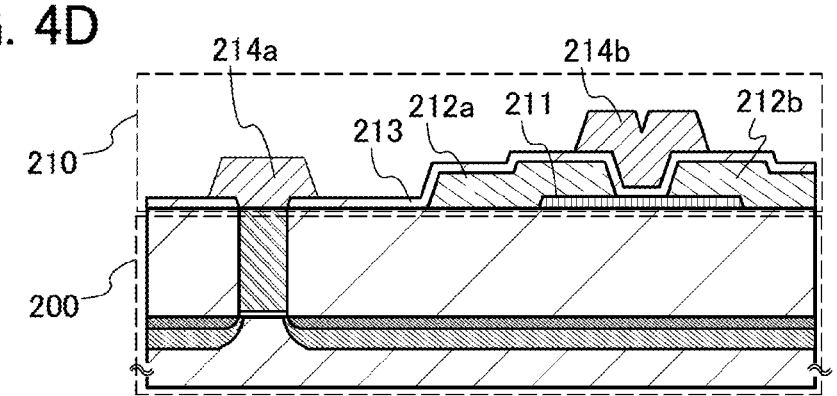

A transistor 210 having a channel formation region in an oxide semiconductor layer includes an oxide semiconductor layer 211 provided over the semiconductor substrate 200 provided with the p-channel transistor and the n-channel transistor, a source electrode 212a and a drain electrode 212b which are in contact with the oxide semiconductor layer 211 and provided apart from each other, a gate insulating film 213 provided over at least a channel formation region of the oxide semiconductor layer 211, and a gate electrode 214b which overlaps with the oxide semiconductor layer 211 and provided over the gate insulating film 213 (FIG. 4D). Note that although not illustrated, an electrode 214a is electrically connected to the gate electrode 214b, and the gate electrode 204 is electrically connected to the electrode 214a.

The interlayer insulating film 205 functions as a base insulating film of the oxide semiconductor layer 211.

It is preferable that the interlayer insulating film 205 contain oxygen at least in its surface and be formed using an insulating oxide in which part of the oxygen is desorbed by heat treatment. As an insulating oxide in which part of oxygen is desorbed by heat treatment, a material containing more oxygen than that in the stoichiometric proportion is preferably used. This is because oxygen can be supplied to an oxide semiconductor film in contact with the interlayer insulating film 205 by the heat treatment.

As an insulating oxide containing more oxygen than that in the stoichiometric proportion, silicon oxide represented by SiOx where x is larger than 2 can be given, for example. However, one embodiment of the present invention is not limited thereto, and the interlayer insulating film 205 may be formed using silicon oxide, silicon oxynitride, silicon nitride oxide, aluminum oxynitride, gallium oxide, hafnium oxide, yttrium oxide, or the like.

Note that the interlayer insulating film 205 may be a stack of a plurality of films. The interlayer insulating film 205 may have a stacked structure in which a silicon oxide film is formed over a silicon nitride film.

In an insulating oxide containing more oxygen than that in the stoichiometric proportion, part of the oxygen is easily desorbed by heat treatment. The desorption amount of oxygen (the value converted into that of oxygen atoms) obtained by TDS analysis when part of oxygen is easily desorbed by heat treatment is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$.

Here, a method using the TDS analysis is described. The desorption amount of gas in the TDS analysis is proportional to a time integral value of ion intensity. Thus, from the ratio of the time integral value of the ion intensity of the oxide to a reference value of a standard sample, the desorption amount of gas can be calculated. The reference value of a standard sample refers to the ratio of the density of a predetermined atom contained in a sample (standard sample) to the integral value of a spectrum.

For example, by using the ion intensity of a silicon wafer containing a predetermined density of hydrogen (standard sample) and the ion intensity of an oxide, the desorption amount ($N_{O2}$) of oxygen molecules ($O_2$) of the oxide can be obtained by the following equation: $N_{O2} = N_{H2}/S_{H2} \times S_{O2} \times \alpha$.

$N_{H2}$ is a value obtained by conversion of the number of hydrogen molecules ($H_2$) desorbed from the standard sample into density. $S_{H2}$ is a time integral value of the ion intensity of hydrogen molecules ($H_2$) of the standard sample. In other words, the reference value of the standard sample is $N_{H2}/S_{H2}$. $S_{O2}$ is a time integral value of the ion intensity of oxygen molecules ($O_2$) of the insulating oxide. $\alpha$ is a coefficient affecting the ion intensity. Refer to Japanese Published Patent Application No. H6-275697 for details of the equation.

Note that the desorption amount of the oxygen obtained by TDS analysis (the value converted into that of oxygen atoms) is measured with use of a silicon wafer containing hydrogen atoms at $1 \times 10^{16}$ atoms/cm$^3$ as the standard sample, by using a thermal desorption spectrometer, EMD-WA1000S/W manufactured by ESCO, Ltd.

Note that in the TDS analysis, part of oxygen is detected as an oxygen atom. The ratio between oxygen molecules and oxygen atoms can be calculated from the ionization rate of the oxygen molecules. Note that, since the coefficient $\alpha$ includes the ionization rate of the oxygen molecules, the number of the released oxygen atoms can also be calculated through the evaluation of the number of the released oxygen molecules.

In addition, $N_{O2}$ is the number of desorbed oxygen molecules ($O_2$). Therefore, the desorption amount of oxygen converted into oxygen atoms is twice the number of desorbed oxygen molecules ($O_2$).

The interlayer insulating film 205 may be formed by a sputtering method, a CVD method, or the like, preferably formed by a sputtering method. In the case of forming a silicon oxide film as the interlayer insulating film 205, a quartz (preferably synthesized quartz) target may be used as a target and an argon gas may be used as a sputtering gas. Alternatively, a silicon target may be used as a target and a gas containing oxygen may be used as a sputtering gas. As a gas containing oxygen, a mixed gas of an argon gas and an oxygen gas may be used or only an oxygen gas may be used.

After the interlayer insulating film 205 is formed, first heat treatment is performed before an oxide semiconductor film to be the oxide semiconductor layer 211 is formed. The first heat treatment is a step for removing water and hydrogen from the interlayer insulating film 205. A temperature of the first heat treatment is preferably higher than or equal to a temperature at which water and hydrogen are desorbed from the interlayer insulating film 205 (a temperature at which desorption amount is at a peak) and lower than a temperature at which the semiconductor substrate 200 provided with the p-channel transistor and the n-channel transistor is changed in quality or shape. The temperature is preferably higher than or equal to 400° C. and lower than or equal to 750° C., and may be lower than a temperature of second heat treatment performed in a later step.

Then, the second heat treatment is performed after the oxide semiconductor film is formed. The second heat treatment is a step for supplying oxygen to the oxide semiconductor film from the interlayer insulating film 205 which is an oxygen supply source. Note that the timing at which the second heat treatment is performed is not limited thereto, and the second heat treatment may be performed after the oxide semiconductor film is processed to form the oxide semiconductor layer 211.

Note that it is preferable that in the second heat treatment, hydrogen, water, a hydroxyl group, hydride, and the like be not contained in a nitrogen gas or a rare gas such as helium, neon, or argon. Alternatively, the purity of a nitrogen gas or a rare gas such as helium, neon, or argon introduced into a heat treatment apparatus is preferably 6N (99.9999%) or higher, more preferably 7N (99.99999%) or higher (that is, the impurity concentration is 1 ppm or lower, preferably 0.1 ppm or lower).

In some cases, the oxide semiconductor film or the oxide semiconductor layer 211 might be crystallized to be a microcrystalline layer or a polycrystalline layer depending on the conditions of the second heat treatment or the material of the oxide semiconductor film or the oxide semiconductor layer 211. For example, the oxide semiconductor film or the oxide semiconductor layer 211 may be crystallized into a microcrystalline oxide semiconductor layer having a degree of crystallization of greater than or equal to 90%, or greater than or equal to 80%. Further, depending on the conditions of the second heat treatment or the material of the oxide semiconductor film or the oxide semiconductor layer 211, the oxide semiconductor film or the oxide semiconductor layer 211 may be an amorphous oxide semiconductor layer including no crystalline component. Alternatively, there is a case where an amorphous layer contains mirocrystals (the crystal grain size is more than or equal to 1 nm and less than or equal to 20 nm).

Note that in the second heat treatment, the interlayer insulating film 205 serves as an oxygen supply source.

Note that the average surface roughness ($R_a$) of the interlayer insulating film 205 which is a formation surface of the oxide semiconductor film is preferably greater than or equal to 0.1 nm and less than 0.5 nm. That is because when the oxide semiconductor film has crystallinity, the crystal orientations thereof can be substantially aligned in the same direction.

Here, the average surface roughness ($R_a$) is obtained by expanding into three dimensions center line average surface roughness ($R_a$) which is defined by JIS B 0601:2001 (ISO 4287:1997) so as to be able to be applied to a measurement surface. The average surface roughness ($R_a$) is an average value of the absolute values of deviations from the reference surface to the specific surface.

Here, the center line average roughness ($R_a$) is shown by the following formula (1) assuming that a portion having a measurement length L is picked up from a roughness curve in the direction of the center line of the roughness curve, the direction of the center line of the roughness curve of the picked portion is represented by an X-axis, the direction of longitudinal magnification (direction perpendicular to the X-axis) is represented by a Y-axis, and the roughness curve is expressed as Y=F(X).

[FORMULA 1]

$$R_a = \frac{1}{L} \int_0^L |F(X)| dX \quad (1)$$

When the measurement surface which is a surface represented by measurement data is expressed as Z=F(X, Y), the average surface roughness ($R_a$) is an average value of the absolute values of deviations from the reference surface to the specific surface and is shown by the following formula (2).

[FORMULA 2]

$$R_a = \frac{1}{S_0} \int_{Y_1}^{Y_2} \int_{X_1}^{X_2} |F(X, Y) - Z_0| dX dY \quad (2)$$

Here, the specific surface is a surface which is a target of roughness measurement, and is a rectangular region which is surrounded by four points represented by the coordinates ($X_1$, $Y_1$), ($X_1$, $Y_2$), ($X_2$, $Y_1$), and ($X_2$, $Y_2$). $S_0$ represents the area of the specific surface when the specific surface is flat ideally.

In addition, the reference surface refers to a surface parallel to an X-Y surface at the average height of the specific surface. In short, when the average value of the height of the specific surface is denoted by $Z_0$, the height of the reference surface is also denoted by $Z_0$.

Chemical mechanical polishing (CMP) treatment may be performed so that the average surface roughness of the interlayer insulating film 205 is greater than or equal to 0.1 nm and less than 0.5 nm in this manner. The CMP treatment may be performed before forming the oxide semiconductor film, preferably before the first heat treatment.

Here, the CMP treatment may be performed once or more. When the CMP process is performed plural times, it is preferable that the first polishing step be performed at a high polishing rate and be followed by a final polishing step at a low polishing rate.

Alternatively, in order to planarize the interlayer insulating film 205, dry etching or the like may be performed instead of the CMP treatment. Here, as an etching gas, a chlorine-based gas such as chlorine, boron chloride, silicon chloride, or carbon tetrachloride, a fluorine-based gas such as carbon tetrafluoride, sulfur fluoride, or nitrogen fluoride, or the like can be used.

Alternatively, in order to planarize the interlayer insulating film 205, plasma treatment or the like may be performed instead of the CMP treatment. Here, a rare gas may be used for the plasma treatment. By the plasma treatment, the surface to be processed is irradiated with ions of an inert gas and minute unevenness of the surface is reduced by a sputtering effect. Such plasma treatment is also referred to as reverse sputtering.

Note that in order to planarize the interlayer insulating film 205, any of the above treatments may be performed. For example, only the reverse sputtering may be performed, or the dry etching may be performed after the CMP treatment. Note that in order to prevent water and the like from entering the interlayer insulating film 205 which is the formation surface of the oxide semiconductor film, the dry etching or the reverse sputtering is preferably performed. In particular, when planarizing treatment is performed after the first heat treatment, the dry etching or the reverse sputtering is preferably performed.

The oxide semiconductor layer 211 may be selectively formed in such a manner that an oxide semiconductor film is formed, an etching mask is formed over the oxide semiconductor film, and etching is performed. Alternatively, an ink-jet method or the like may be used.

The oxide semiconductor film preferably contains indium (In) or zinc (Zn). In particular, both In and Zn are preferably contained. In addition, gallium (Ga) is preferably contained. When gallium (Ga) is contained, variation in the transistor characteristics can be reduced. Such an element capable of reducing variation in the transistor characteristics is referred to as a stabilizer. As a stabilizer, tin (Sn), hafnium (Hf), or aluminum (Al) can be given.

As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given. One or a plurality of these elements can be used.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be given.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions. Alternatively, an In-Sn-Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the oxide semiconductor film which can be used in one embodiment of the present invention is not limited to those described above, and an oxide semiconductor film including an appropriate composition may be used in accordance with needed semiconductor characteristics (the mobility, the threshold value, the variation, and the like). In accordance with needed transistor characteristics (semiconductor characteristics), the carrier density, the impurity concentration, the defect density, the atomic ratio of a metal element and oxygen, the interatomic distance, the density, and the like may be appropriately adjusted.

For example, relatively high mobility can be obtained with the use of an In—Sn—Zn-based oxide. However, the mobility can be increased by reducing the defect density in the bulk also in the case of using the In—Ga—Zn-based oxide.

The oxide semiconductor may be either single crystal or non-single-crystal. In the case where the oxide semiconductor is non-single-crystal, the oxide semiconductor may be either amorphous or polycrystalline. Further, the oxide semiconductor may have a structure including a crystalline portion in an amorphous portion. Alternatively, the oxide semiconductor may be non-amorphous.

Note that it is preferable that excess oxygen be contained in the metal oxide as compared to oxygen in the stoichiometric proportion. When excess oxygen is contained, generation of carriers due to oxygen deficiency in the oxide semiconductor film to be formed can be prevented.

Note that for example, in the case where the oxide semiconductor film is formed using an In—Zn-based metal oxide, a target has a composition ratio where In/Zn is 1 to 100, preferably 1 to 20, more preferably 1 to 10 in an atomic ratio. When the atomic ratio of In with respect to Zn is in the above preferred range, the field-effect mobility can be improved. Here, when the atomic ratio of the metal oxide is In:Zn:O=X:Y:Z, it is preferable to satisfy the relation of $Z>1.5X+Y$ so that excess oxygen is contained.

Here, the filling rate of the target is greater than or equal to 90% and less than or equal to 100%, preferably greater than or equal to 95% and less than or equal to 99.9%. With a high filling rate, a dense oxide semiconductor film can be formed.

Note that the energy gap of a metal oxide which can be applied to the oxide semiconductor film is preferably 2 eV or more, more preferably 2.5 eV or more, still more preferably 3 eV or more. In this manner, the off-state current of a transistor can be reduced by using a metal oxide having a wide band gap.

Note that the oxide semiconductor film contains hydrogen. Note that the hydrogen may be contained in the oxide semiconductor film in the form of a hydrogen molecule, water, a hydroxyl group, or hydride in some cases, in addition to a hydrogen atom. It is preferable that hydrogen contained in the oxide semiconductor film be as little as possible.

Note that the concentrations of an alkali metal and an alkaline earth metal in the oxide semiconductor film are preferably low, and these concentrations are preferably lower than or equal to $1\times10^{18}$ atoms/cm$^3$, more preferably lower than or equal to $2\times10^{16}$ atoms/cm$^3$. When an alkali metal and an alkaline earth metal are bonded to an oxide semiconductor, a carrier may be generated, which causes increase in the off-state current of the transistor.

Note that there is no particular limitation on the formation method and the thickness of the oxide semiconductor film, and they can be determined in consideration of the size or the like of a transistor to be manufactured. As an example of a method for forming the oxide semiconductor film, a sputtering method, a molecular beam epitaxy method, a coating method, a printing method, a pulsed laser deposition method, or the like can be given. The thickness of the oxide semiconductor film is preferably greater than or equal to 3 nm and less than or equal to 50 nm. This is because when the thickness is greater than 50 nm, the transistor might be normally on. When the thickness of the oxide semiconductor film is less than or equal to 5 nm in the case where the channel length of the transistor is 30 μm, a short channel effect can be prevented.

Here, as a preferable example, the oxide semiconductor film is formed by a sputtering method using an In—Ga—Zn-based metal oxide target. A rare gas (e.g., an argon gas), an oxygen gas, or a mixed gas of a rare gas and an oxygen gas may be used as a sputtering gas.

It is preferable that a high-purity gas from which hydrogen, water, a hydroxyl group, or hydride is removed be used as the sputtering gas for the formation of the oxide semiconductor film. In order to highly purify the sputtering gas, a gas attached to the inner wall of a treatment chamber or the like is removed and a heat treatment is performed on the semiconductor substrate 200 provided with the p-channel transistor and the n-channel transistor before the oxide semiconductor film is formed. Further, a sputtering gas introduced into the treatment chamber may be a high-purity gas. In that case, when an argon gas is used, it is preferable that the purity be 9N (99.9999999%) or more, the dew point be −121° C. or lower, the content of water be 0.1 ppb or lower, and the content of hydrogen be 0.5 ppb or lower. When an oxygen gas is used, it is preferable that the purity be 8N (99.999999%) or more, the dew point be −112° C. or lower, the content of water be 1 ppb or lower, and the content of hydrogen be 1 ppb or lower. The oxide semiconductor film is formed while the semiconductor substrate 200 provided with the p-channel transistor and the n-channel transistor is heated and kept at high temperature, so that the concentration of impurities, such as water, contained in the oxide semiconductor film can be reduced. Moreover, damage in the oxide semiconductor film caused by a sputtering method can be reduced. Here, the temperature of the semiconductor substrate 200 provided with the p-channel transistor and the n-channel transistor may be higher than or equal to 100° C. and lower than or equal to 600° C., preferably higher than or equal to 200° C. and lower than or equal to 400° C.

Further, excess oxygen can be supplied to the oxide semiconductor film by ion implantation.

Note that the oxide semiconductor film may have an amorphous structure or a crystalline structure. In a preferable embodiment of the case where the oxide semiconductor film has a crystalline structure, a c-axis aligned crystalline (CAAC) oxide semiconductor film can be given. When the oxide semiconductor film is a CAAC oxide semiconductor film, the reliability of the transistor can be increased.

Note that a CAAC oxide semiconductor film means an oxide semiconductor film including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (or the surface, or at the interface) (the crystal rotates around the c-axis).

In a broad sense, a CAAC oxide semiconductor film means a non-single-crystal oxide including a phase which has a triangular, hexagonal, regular triangular, or regular hexagonal atomic when seen from the direction perpendicular to the a-b plane and in which metal atoms are arranged in a layered manner or metal atoms and oxygen atoms are arranged in a layered manner when seen from the direction perpendicular to the c-axis.

The CAAC oxide semiconductor film is not a single crystal, but this does not mean that the CAAC oxide semiconductor film is composed of only an amorphous component. Although the CAAC oxide semiconductor film includes a crystallized portion (crystalline portion), a boundary between one crystalline portion and another crystalline portion is not necessarily clear.

Nitrogen may be substituted for part of oxygen included in the CAAC oxide semiconductor film. The c-axes of individual crystalline portions included in the CAAC oxide semiconductor film may be aligned in one direction (e.g., a direction perpendicular to a surface of a substrate over which the CAAC oxide semiconductor film is formed, a surface, or an interface of the CAAC oxide semiconductor film). Alternatively, normals of the a-b planes of individual crystalline portions included in the CAAC oxide semiconductor film may be aligned in one direction (e.g., a direction perpendicular to the surface of the substrate over which the CAAC oxide semiconductor film is formed, the surface, or the interface of the CAAC oxide semiconductor film)

Note that the CAAC oxide semiconductor film may be a conductor, a semiconductor, or an insulator depending on its composition or the like. Further, the CAAC oxide semiconductor film may transmit or not transmit visible light depending on its composition or the like.

As an example of such a CAAC oxide semiconductor film, there is a material which is formed into a film shape and has a triangular or hexagonal atomic arrangement when observed from the direction perpendicular to a surface of the film, a surface of a substrate, or an interface and in which metal atoms are arranged in a layered manner or metal atoms and oxygen atoms (or nitrogen atoms) are arranged in a layered manner when a cross section of the film is observed.

An example of a crystal structure included in the CAAC oxide semiconductor film is described in detail with reference to FIGS. 5A to 5E, FIGS. 6A to 6C, and FIGS. 7A to 7C. In FIGS. 5A to 5E, FIGS. 6A to 6C, and FIGS. 7A to 7C, the vertical direction corresponds to the c-axis direction and a plane perpendicular to the c-axis direction corresponds to the a-b plane, in principle. When the expression "an upper half" or "a lower half" is simply used, the boundary is the a-b plane. Furthermore, in FIGS. 5A to 5E, O surrounded by a circle represents tetracoordinate O and O surrounded by a double circle represents tricoordinate O.

Figure 5A:
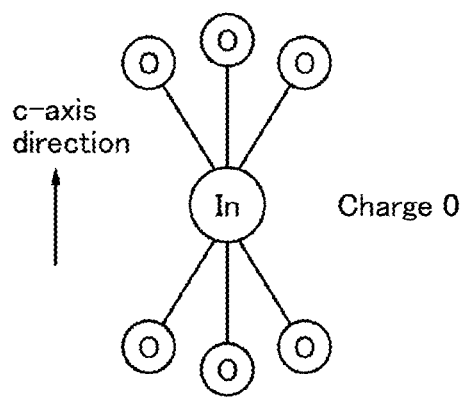
FIGS. 5A to 5E are diagrams each illustrating a crystal structure of an oxide semiconductor which can be applied to a transistor.

FIG. 5A illustrates a structure including one hexacoordinate indium (hereinafter referred to as In) atom and six tetracoordinate oxygen (hereinafter referred to as tetracoordinate O) atoms proximate to the In atom. Here, a structure including one In atom and oxygen atoms proximate thereto is referred to as a subunit. The structure in FIG. 5A is actually an octahedral structure, but is illustrated as a planar structure for simplicity. Note that three tetracoordinate O atoms exist in each of an upper half and a lower half in FIG. 5A. In the subunit illustrated in FIG. 5A, electric charge is 0.

Figure 5D:
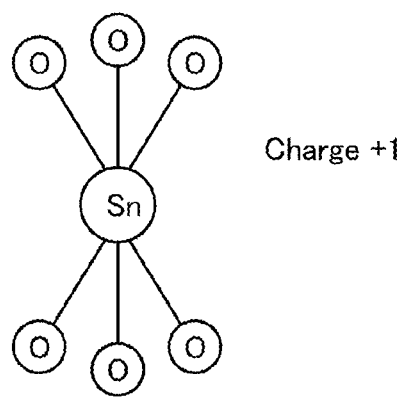
Figure 5B:
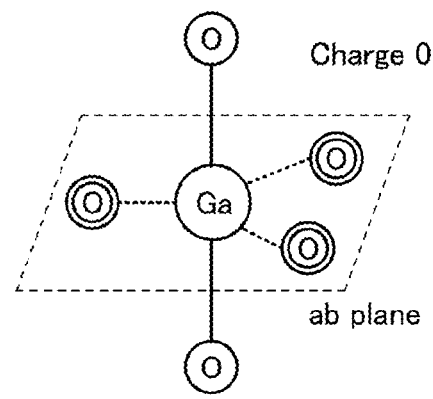

FIG. 5B illustrates a structure including one pentacoordinate gallium (hereinafter referred to as Ga) atom, three tricoordinate oxygen (hereinafter referred to as tricoordinate O)

atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 5B. An In atom can also have the structure illustrated in FIG. 5B because an In atom can have five ligands. In the subunit illustrated in FIG. 5B, electric charge is 0.

Figure 5E:
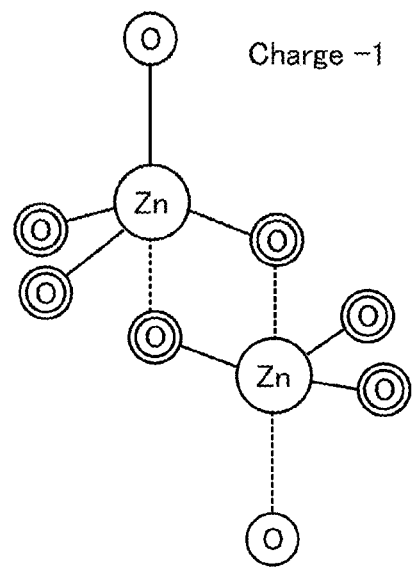
Figure 5C:
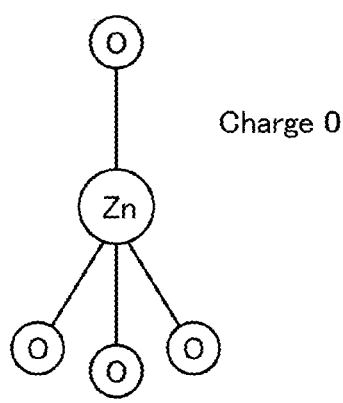

FIG. 5C illustrates a structure including one tetracoordinate zinc (hereinafter referred to as Zn) atom and four tetracoordinate O atoms proximate to the Zn atom. In FIG. 5C, one tetracoordinate O atom exists in an upper half and three tetracoordinate O atoms exist in a lower half In the subunit illustrated in FIG. 5C, electric charge is 0.

FIG. 5D illustrates a structure including one hexacoordinate tin (hereinafter referred to as Sn) atom and six tetracoordinate O atoms proximate to the Sn atom. In FIG. 5D, three tetracoordinate O atoms exist in each of an upper half and a lower half In the subunit illustrated in FIG. 5D, electric charge is +1.

FIG. 5E illustrates a subunit including two Zn atoms. In FIG. 5E, one tetracoordinate O atom exists in each of an upper half and a lower half In the subunit illustrated in FIG. 5E, electric charge is −1.

Here, a plurality of subunits forms one group, and a plurality of groups forms a unit which is one cycle.

Now, a rule of bonding between the subunits is described. The three O atoms in the upper half with respect to the hexacoordinate In atom in FIG. 5A each have three proximate In atoms in the downward direction, and the three O atoms in the lower half each have three proximate In atoms in the upward direction. The one O atom in the upper half with respect to the pentacoordinate Ga atom in FIG. 5B has one proximate Ga atom in the downward direction, and the one O atom in the lower half has one proximate Ga atom in the upward direction. The one O atom in the upper half with respect to the tetracoordinate Zn atom in FIG. 5C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, one group can be formed in a different manner by combining subunits so that the total electric charge of the layered structure is 0.

Figure 6A:
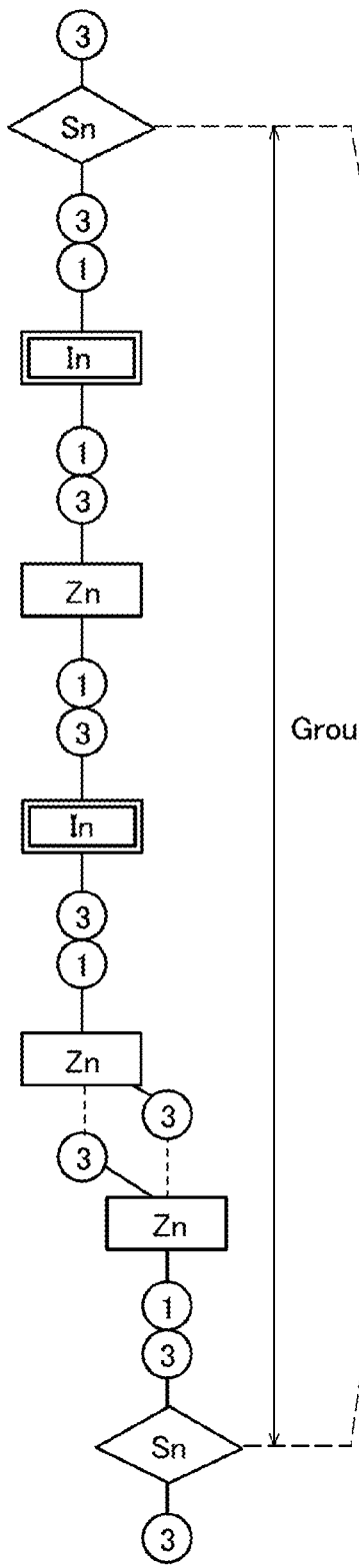
FIGS. 6A to 6C are diagrams illustrating a crystal structure of an oxide semiconductor which can be applied to a transistor.
Figure 6B:
Figure 6C:
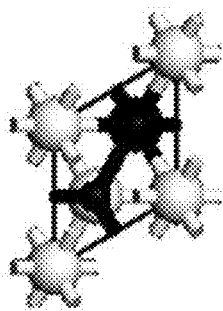

FIG. 6A illustrates a model of one group included in a layered structure of an In—Sn—Zn-based material. FIG. 6B illustrates a unit including three groups. Note that FIG. 6C illustrates an atomic arrangement in the case where the layered structure in FIG. 6B is observed from the c-axis direction.

In FIG. 6A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 6A, one tetracoordinate O atom existing in each of an upper half and a lower half with respect to an In atom is denoted by circled 1. FIG. 6A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn-based material in FIG. 6A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A plurality of such groups is bonded, so that a unit which is one cycle is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a subunit including a Sn atom is +1. Therefore, electric charge of −1, which cancels +1, is needed to form a layered structure including a Sn atom. As a structure having electric charge of −1, the subunit including two Zn atoms as illustrated in FIG. 5E can be given. For example, with one subunit including two Zn atoms, electric charge of one subunit including a Sn atom can be cancelled, so that the total electric charge of the layered structure can be 0.

An In atom can have either five ligands or six ligands. When the unit illustrated in FIG. 6B is used, an In—Sn—Zn-based crystal ($In_2SnZn_3O_8$) can be obtained. Note that a layered structure of the obtained In—Sn—Zn-based crystal can be expressed as a composition formula, $In_2SnZn_2O_7(ZnO)_m$ (m is 0 or a natural number).

The same is applied to the case where a metal oxide other than the In—Sn—Zn-based metal oxide is used. As an example, FIG. 7A illustrates a model of one group included in a layered structure of an In—Ga—Zn-based crystal.

Figure 7A:
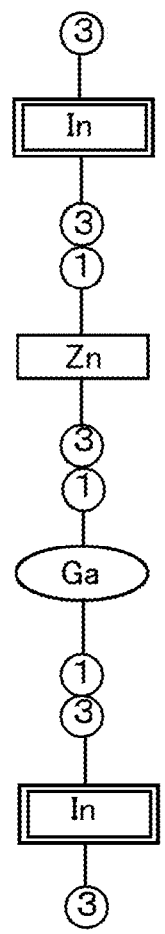
FIGS. 7A to 7C are diagrams illustrating a crystal structure of an oxide semiconductor which can be applied to a transistor.

In the group included in the layered structure of the In—Ga—Zn-based material in FIG. 7A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such groups is bonded, so that a unit which is one cycle is formed.

Figure 7B:
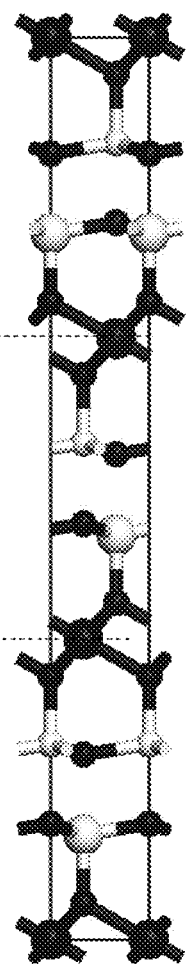
Figure 7C:
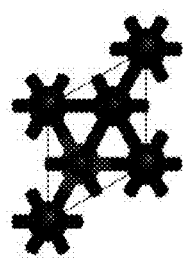

FIG. 7B illustrates a unit including three groups. Note that FIG. 7C illustrates an atomic arrangement in the case where the layered structure in FIG. 7B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a subunit including any of an In atom, a Zn atom, and a Ga atom is 0. As a result, the total electric charge of one group having a combination of such subunits is always 0.

A group forming the layered structure of the In—Ga—Zn-based crystal is not limited to the group illustrated in FIG. 7A.

Here, a method for forming the CAAC oxide semiconductor film is described.

First, an oxide semiconductor film is formed by a sputtering method or the like. Note that the oxide semiconductor film is formed while the semiconductor substrate 200 provided with the p-channel transistor and the n-channel transistor is kept at high temperature, so that the ratio of a crystalline portion to an amorphous portion can be high. At that time, the temperature of the semiconductor substrate 200 provided with the p-channel transistor and the n-channel transistor may be, for example, higher than or equal to 150° C. and lower than or equal to 450° C., preferably higher than or equal to 200° C. and lower than or equal to 350° C.

Here, the formed oxide semiconductor film may be subjected to heat treatment. By the heat treatment, the ratio of a crystalline portion to an amorphous portion can be high. The temperature of the semiconductor substrate 200 provided with the p-channel transistor and the n-channel transistor at the heat treatment may be higher than or equal to 200° C. and lower than a temperature at which the semiconductor substrate 200 provided with the p-channel transistor and the n-channel transistor is changed in quality or shape, preferably higher than or equal to 250° C. and lower than or equal to 450° C. The time for the heat treatment may be longer than or equal to 3 minutes, and preferably shorter than or equal to 24 hours. This is because the time for the heat treatment decreases the productivity although the ratio of a crystalline portion to an amorphous portion can be high. Note that the heat treatment may be performed in an oxidation atmosphere or an inert atmosphere; however, there is no limitation thereon. This heat treatment may be performed under a reduced pressure.

The oxidizing atmosphere is an atmosphere containing an oxidizing gas. As an example of the oxidizing gas, oxygen, ozone, and nitrous oxide can be given. It is preferable that components (e.g., water and hydrogen) which are not preferably contained in the oxide semiconductor film be removed from the oxidation atmosphere as much as possible. For example, the purity of oxygen, ozone, or nitrous oxide is greater than or equal to 8N (99.999999%), preferably greater than or equal to 9N (99.9999999%).

The oxidation atmosphere may contain an inert gas such as a rare gas. Note that the oxidation atmosphere contains an oxidizing gas at a concentration of greater than or equal to 10 ppm. Note that an inert atmosphere contains an inert gas (a nitrogen gas, a rare gas, or the like) and contains a reactive gas such as an oxidizing gas at a concentration of less than 10 ppm.

Note that a rapid thermal anneal (RTA) apparatus may be used for all of the heat treatments. With the use of the RTA apparatus, only in a short time, the heat treatments can be performed at high temperature. Thus, the oxide semiconductor film having a high ratio of a crystalline portion to an amorphous portion can be formed and decrease in productivity can be suppressed.

However, the apparatus used for all of the heat treatments is not limited to an RTA apparatus; for example, an apparatus provided with a unit that heats an object to be processed by thermal conduction or thermal radiation from a resistance heater or the like may be used. For example, an electric furnace or a rapid thermal anneal (RTA) apparatus such as a gas rapid thermal anneal (GRTA) apparatus or a lamp rapid thermal anneal (LRTA) apparatus can be given as the heat treatment apparatus used for all of the heat treatments. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed using a high-temperature gas as a heat medium. Here, the temperature of the high-temperature gas is preferably higher than the heat temperature of the object to be processed.

With use of an In—Ga—Zn-based metal oxide in which the nitrogen concentration is higher than or equal to $1\times10^{17}$ atoms/cm$^3$ and lower than or equal to $5\times10^{19}$ atoms/cm$^3$, a metal oxide film having a c-axis-aligned hexagonal crystal structure is formed and one or more layers containing Ga and Zn are provided between two layers of the In—O crystal planes (crystal planes containing indium and oxygen).

In order to form an In—Sn—Zn-based metal oxide, a target having an atomic ratio of In:Sn:Zn=1:2:2, 2:1:3, 1:1:1, or 20:45:35 may be used.

As described above, the CAAC oxide semiconductor film can be formed.

The CAAC oxide semiconductor film has high orderliness of a bond between metal and oxygen as compared to an oxide semiconductor film having an amorphous structure. In other words, in the case of an oxide semiconductor film having an amorphous structure, the number of oxygen atoms coordinated around a metal atom varies according to the kind of an adjacent metal. In contrast, in the case of the CAAC oxide semiconductor film, the number of oxygen atoms coordinated around a metal atom is substantially the same. Therefore, oxygen deficiency is hardly observed even at a microscopic level, and charge transfer and instability of electric conductivity due to hydrogen atoms (including hydrogen ions), alkali metal atoms, or the like can be prevented.

Therefore, a transistor is formed using a CAAC oxide semiconductor film for its channel formation region, whereby the threshold voltage of the transistor can be prevented from changing after light irradiation or a bias-temperature stress (BT) test performed on the transistor, and the transistor can have stable electric characteristics.

Next, an etching mask is formed over the oxide semiconductor film and etching is performed, whereby the oxide semiconductor layer 211 is formed (FIG. 4A).

In addition, the source electrode 212a and the drain electrode 212b are formed to be in contact with the oxide semiconductor layer 211 and to be apart from each other (FIG. 4B).

The source electrode 212a and the drain electrode 212b may be selectively formed in such a manner that, for example, a conductive film (e.g., a metal film or a silicon film to which an impurity element imparting one conductivity type is added) is formed by a sputtering method, an etching mask is formed over the conductive film, and etching is performed. Alternatively, an ink-jet method may be used. Note that the conductive film to be the source electrode 212a and the drain electrode 212b may be formed to have either a single-layer structure or a structure in which a plurality of layers are stacked. For example, the conductive film may be formed to have a three-layer structure in which an Al layer is sandwiched between Ti layers. Note that a layer serving as the source electrode 212a and the drain electrode 212b also functions as a signal line.

Next, the gate insulating film 213 is formed over at least the channel formation region of the oxide semiconductor layer 211, and after that, an opening is formed (FIG. 4C). The opening is formed to overlap with the gate electrode 204.

The gate insulating film 213 may be formed using an insulating material (e.g., silicon nitride, silicon nitride oxide, silicon oxynitride, or silicon oxide) by a sputtering method, for example. Note that the gate insulating film 213 may have a single-layer structure or a stacked structure including a plurality of layers. A stacked structure of two layers in which a silicon oxynitride layer is stacked over a silicon nitride layer is employed here, for example. Note that in the case where the gate insulating film 213 is formed by a sputtering method, hydrogen and moisture can be prevented from entering the oxide semiconductor layer 211. The gate insulating film 213 is preferably an insulating oxide film because oxygen vacancies can be filled by supply of oxygen.

Note that, "silicon nitride oxide" contains more nitrogen than oxygen. Note that "silicon oxynitride" contains more oxygen than nitrogen.

Here, the oxide semiconductor film may be processed by dry etching. For example, a chlorine gas or a mixed gas of a boron trichloride gas and a chlorine gas may be used as an etching gas used for the dry etching. However, there is no limitation thereon; wet etching may be used or another method capable of processing the oxide semiconductor film may be used.

The gate insulating film 213 contains oxygen at least in a portion in contact with the oxide semiconductor layer 211 and is preferably formed using an insulating oxide in which part of the oxygen is desorbed by heating. In other words, the materials given as the material of the interlayer insulating film 205 are preferably used. When the portion of the gate insulating film 213 which is in contact with the oxide semiconductor layer 211 is formed using silicon oxide, oxygen can be diffused into the oxide semiconductor layer 211 and reduction in the resistance of the transistor can be prevented.

Note that the gate insulating film 213 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, yttrium oxide, or lanthanum oxide, whereby gate leakage current can be reduced. Here, gate leakage current refers to leakage current which flows between a gate electrode and a source or drain electrode. Further, a layer formed using the high-k material and a layer formed using silicon oxide, silicon oxynitride, silicon nitride, silicon nitride oxide, aluminum oxide, aluminum oxynitride, or gallium oxide may be stacked. Note that even in the case where the gate insulating film 213 has a stacked structure, the portion in contact with the oxide semiconductor layer 211 is preferably formed using an insulating oxide.

The gate insulating film 213 may be formed by a sputtering method. The thickness of the gate insulating film 213 is greater than or equal to 1 nm and less than or equal to 300 nm, preferably greater than or equal to 5 nm and less than or equal to 50 nm. When the thickness of the gate insulating film 213 is greater than or equal to 5 nm, gate leakage current can be particularly reduced.

In addition, third heat treatment (preferably at a temperature higher than or equal to 200° C. and lower than or equal to 400° C., for example, at a temperature higher than or equal to 250° C. and lower than or equal to 350° C.) may be performed in an inert gas atmosphere or an oxygen gas atmosphere. The third heat treatment allows hydrogen or moisture remaining in the oxide semiconductor layer 211 to be diffused into the gate insulating film. Further, the third heat treatment allows the oxide semiconductor layer 211 to be supplied with oxygen from the gate insulating film 213 as a supply source.

The third heat treatment is performed after the gate insulating film 213 is formed over the oxide semiconductor layer 211 here, but the timing is not limited thereto. The third heat treatment may be performed after the electrode 214a and the gate electrode 214b are formed or a conductive film to be the electrode 214a and the gate electrode 214b is formed.

Note that the hydrogen concentration of the oxide semiconductor layer 211 is $5.0 \times 10^{19}$ atoms/cm$^3$ or lower, preferably $5.0 \times 10^{18}$ atoms/cm$^3$ or lower. The hydrogen concentration is reduced in this manner, whereby the threshold voltage of the transistor can be prevented from shifting in the negative direction.

Note that the carrier concentration of the oxide semiconductor layer 211 is preferably lower than $1.0 \times 10^{14}$/cm$^3$. The carrier concentration is reduced, whereby the off-state current can be kept low.

Next, a conductive film is formed over the gate insulating film 213 and an etching mask is formed thereover to perform etching, whereby the electrode 214a and the gate electrode 214b are formed (FIG. 4D).

The electrode 214a and the gate electrode 214b may be formed using the same materials and methods as those of the source electrode 212a and the drain electrode 212b.

Note that although not illustrated, it is preferable that dopant be added to the oxide semiconductor layer 211 to form a source region and a drain region in the oxide semiconductor layer 211.

Here, the dopant may be added by an ion implantation method or an ion doping method. Alternatively, the dopant may be added by performing plasma treatment in an atmosphere of a gas containing the dopant. As the added dopant, nitrogen, phosphorus, boron, or the like may be used.

As described above, an oxide semiconductor transistor can be formed over the transistor formed using a semiconductor substrate as illustrated in FIG. 3.

As described above, an oxide semiconductor is preferably used for an oxide semiconductor transistor. A transistor including an oxide semiconductor can have high field effect mobility.

Note that the actual field effect mobility of the transistor including an oxide semiconductor is lower than its original mobility. A factor of reduction in mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed by the following formula (3).

[FORMULA 3]

$$\mu = \mu_0 \exp\left(-\frac{E}{kT}\right) \quad (3)$$

Here, E represents the height of the potential barrier, k represents the Boltzmann constant, and T represents the absolute temperature. When the potential barrier is assumed to be attributed to a defect, the height of the potential barrier can be expressed by the following formula (4) according to the Levinson model.

[FORMULA 4]

$$E = \frac{e^2 N^2}{8\varepsilon n} = \frac{e^3 N^2 t}{8\varepsilon C_{ox} V_g} \quad (4)$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer.

The drain current $I_d$ in a linear region can be expressed by the following formula (5).

[FORMULA 5]

$$I_d = \frac{W \mu V_g V_d C_{ox}}{L} \exp\left(-\frac{E}{kT}\right) \quad (5)$$

Here, L represents the channel length and W represents the channel width, and L and W are each 10 µm. In addition, $V_d$ represents the drain voltage. When dividing both sides of the formula (5) by $V_g$ and then taking logarithms of both sides, the following formula (6) can be obtained.

[FORMULA 6]

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT \varepsilon C_{ox} V_g} \quad (6)$$

The right side of the formula (6) is a function of $V_g$. From the formula (6), it is found that the defect density N can be obtained from the slope of a line in a graphwhich is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm$^2$/Vs from the formula (3) and the formula (4). The measured mobility of an In—Sn—Zn oxide including a defect is approximately 40 cm$^2$/Vs. However, the obtained result shows that when no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by the following formula (7).

[FORMULA 7]

$$\frac{1}{\mu_1} = \frac{1}{\mu_0} + \frac{D}{B} \exp\left(-\frac{x}{l}\right) \quad (7)$$

Here, D represents the electric field in the gate direction, and B and l are constants. B and l can be obtained from actual measurement results; according to the above measurement results, B is $4.75 \times 10^7$ cm/s and l is 10 nm (the depth to which the influence of interface scattering reaches). When D is increased (i.e., when the gate voltage is increased), the second term of the formula (7) is increased and accordingly the mobility $\mu_1$ is decreased.

Figure 8:
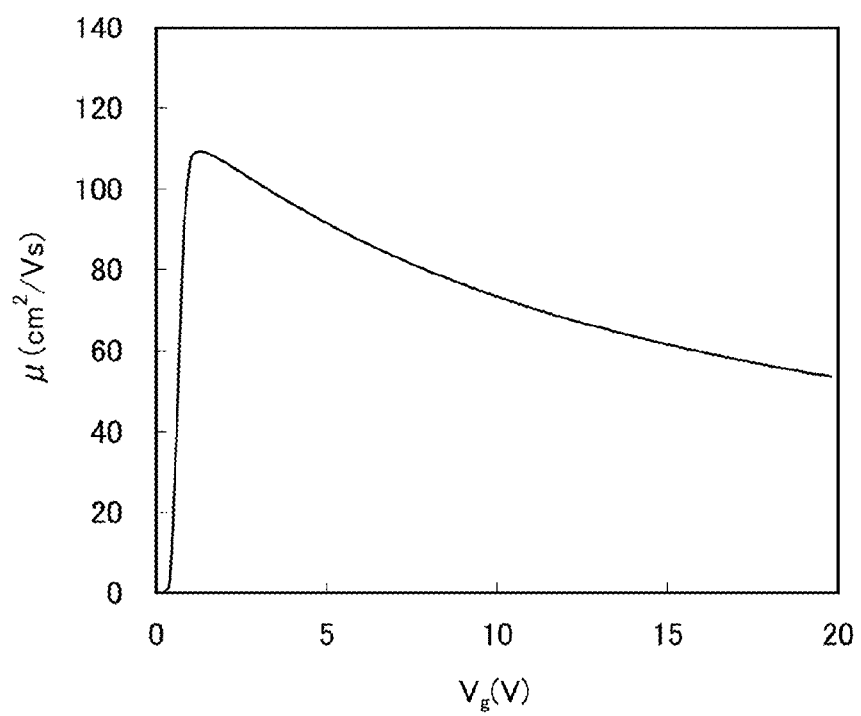
FIG. 8 is a graph showing dependence of mobility on gate voltage obtained by calculation.

Calculation results of the mobility $\mu_2$ of a transistor whose channel includes an ideal oxide semiconductor without a defect inside the semiconductor are shown in FIG. 8. For the calculation, device simulation software Sentaurus Device (manufactured by Synopsys, Inc.) was used, and the bandgap, the electron affinity, the relative permittivity, and the thickness of the oxide semiconductor were assumed to be 2.8 eV, 4.7 eV, 15, and 15 nm, respectively. Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 µm, and the drain voltage $V_d$ was assumed to be 0.1 V.

As shown in FIG. 8, the mobility has a peak of 100 cm$^2$/Vs or more at a gate voltage that is a little over 1 V and is decreased as the gate voltage becomes higher because the influence of interface scattering is increased. Note that in order to reduce interface scattering, as described with reference to the formula (1), it is preferable that a surface of the semiconductor layer be flat at the atomic level (atomic layer flatness).

Figure 10A:
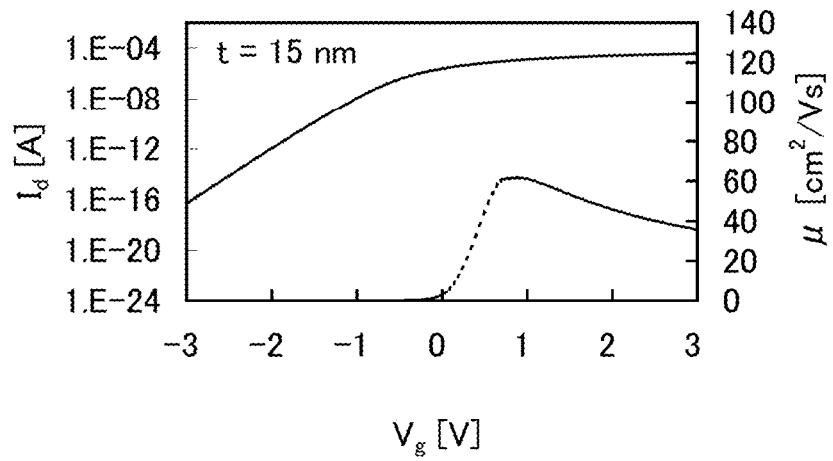
FIGS. 10A to 10C are graphs each showing dependence of drain current and mobility on gate voltage obtained by calculation.
Figure 10B:
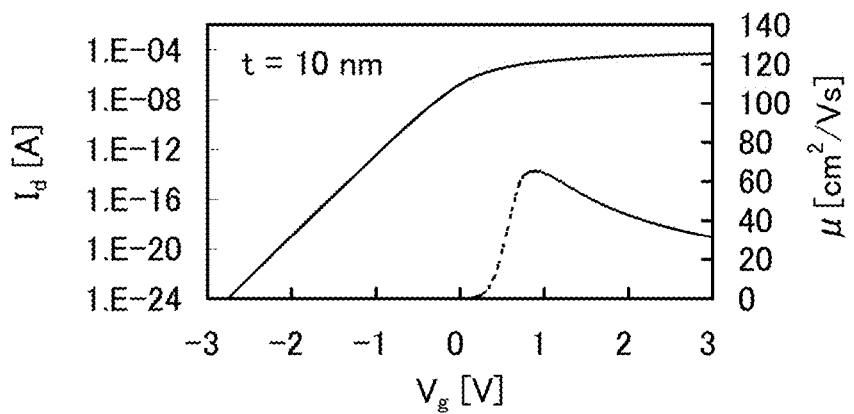
Figure 10C:
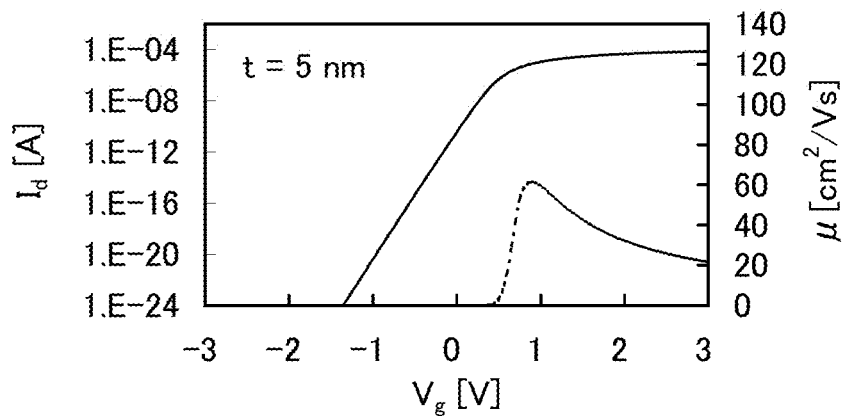
Figure 11A:
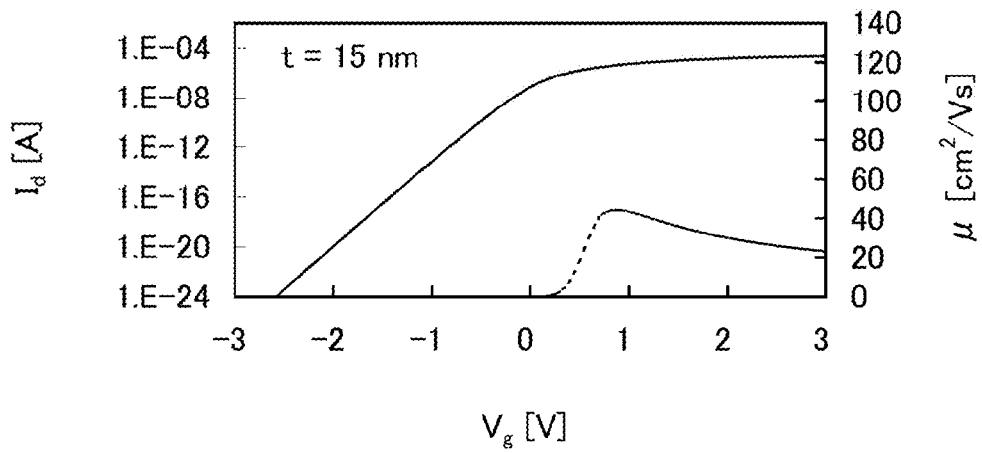
FIGS. 11A to 11C are graphs each showing dependence of drain current and mobility on gate voltage obtained by calculation.
Figure 11B:
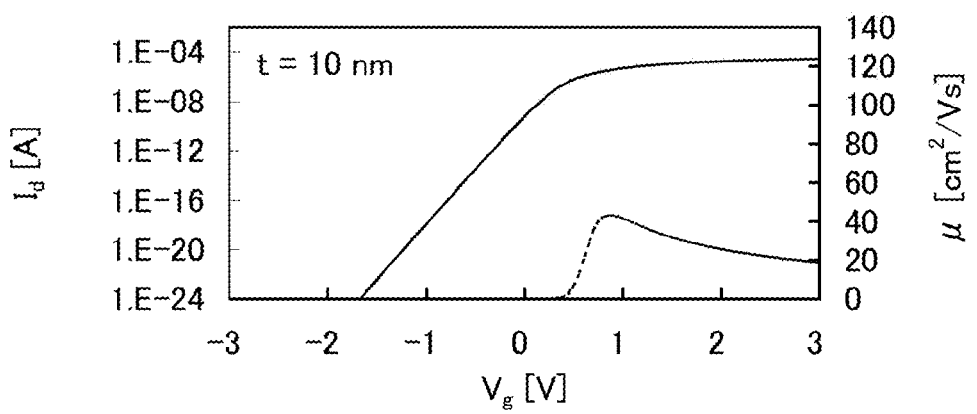
Figure 11C:
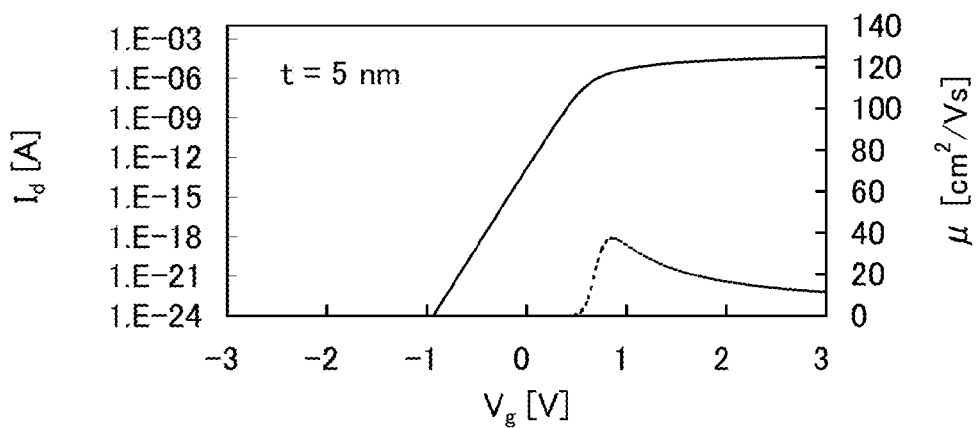
Figure 12A:
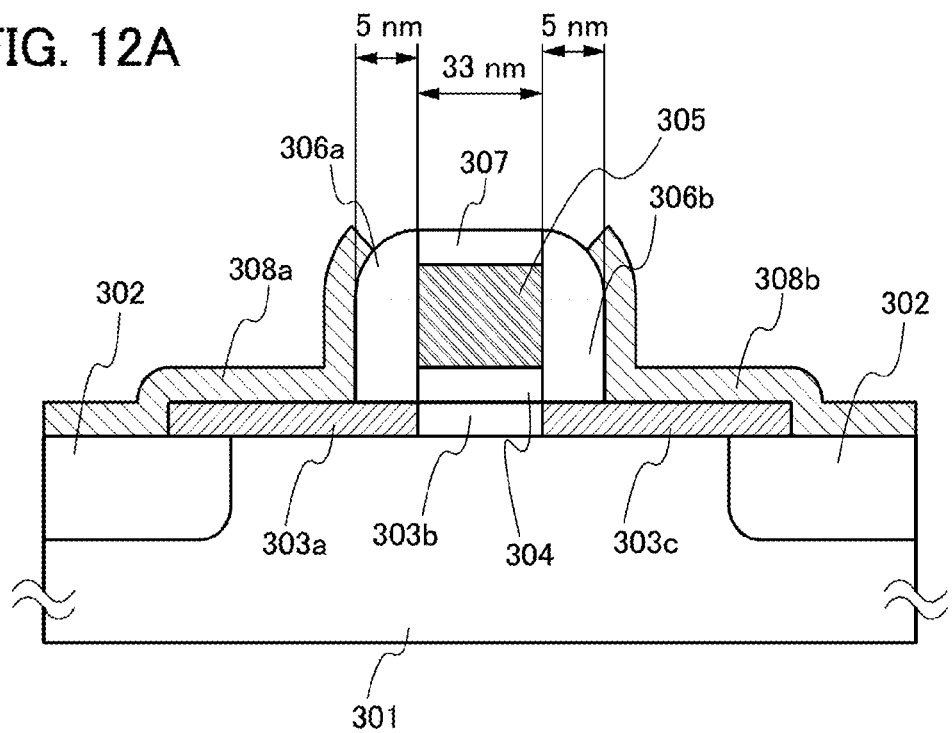
FIGS. 12A and 12B each illustrate a cross-sectional structure of a transistor used in calculation.
Figure 12B:
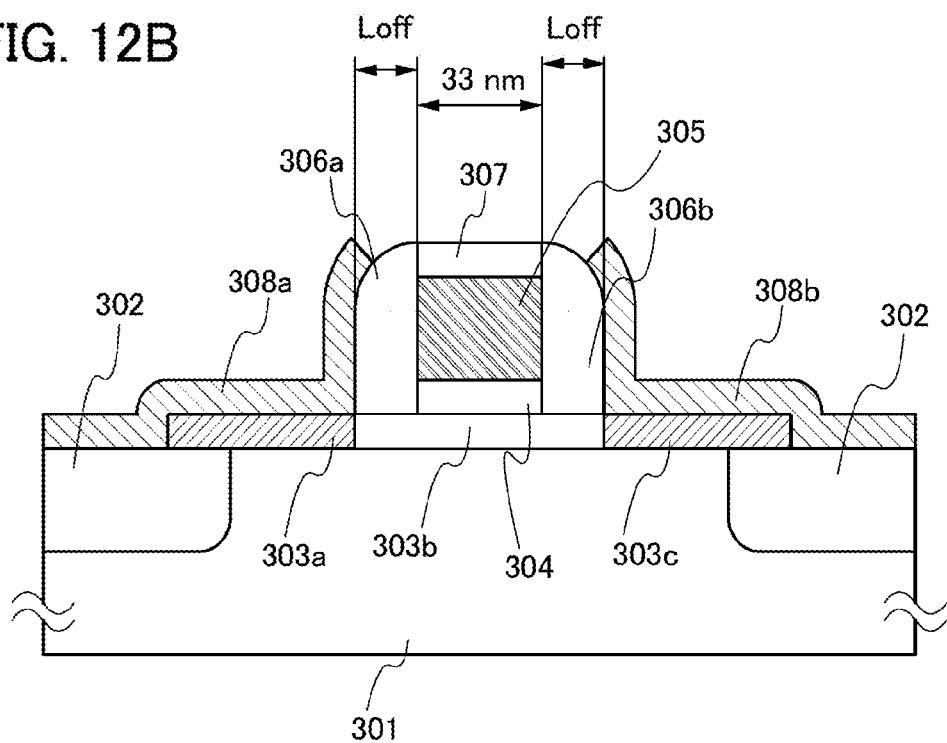

Calculation results of characteristics of minute transistors which are manufactured using an oxide semiconductor having such a mobility are shown in FIGS. 9A to 9C, FIGS. 10A to 10C, and FIGS. 11A to 11C. Here, FIGS. 12A and 12B illustrate cross-sectional structures of the transistors used for the calculation. The transistors illustrated in FIGS. 12A and 12B each include a semiconductor region 303a and a semiconductor region 303c which have n$^+$-type conductivity in an oxide semiconductor layer. In the calculation, the resistivity of the semiconductor regions 303a and 303c is $2 \times 10^{-3}$ Ωcm.

The transistor illustrated in FIG. 12A includes a base insulating film 301, an embedded insulating film 302 which is formed of aluminum oxide and is embedded in the base insulating film 301, a semiconductor region 303a, a semiconductor region 303c, an intrinsic semiconductor region 303b that is placed between the semiconductor regions 303a and 303c and serves as a channel formation region, and a gate 305. In the calculation, the gate 305 has a width of 33 nm.

A gate insulating film 304 is formed between the gate 305 and the semiconductor region 303b. In addition, a sidewall insulator 306a and a sidewall insulator 306b are formed on both side surfaces of the gate 305, and an insulating film 307 is formed over the gate 305 so as to prevent a short circuit between the gate 305 and another wiring. The sidewall insulator has a width of 5 nm A source 308a and a drain 308b are provided in contact with the semiconductor region 303a and the semiconductor region 303c, respectively. Note that the channel width of this transistor is 40 nm The transistor illustrated in FIG. 12B includes the base insulating film 301, the embedded insulating film 302 formed of aluminum oxide, the semiconductor region 303a, the semiconductor region 303c, the intrinsic semiconductor region 303b that is placed between the semiconductor regions 303a and 303c and serves as a channel formation region, the gate insulating film 304, the gate 305, the sidewall insulator 306a, the sidewall insulator 306b, the insulating film 307, the source 308a, and the drain 308b.

The transistor illustrated in FIG. 12A is different from the transistor illustrated in FIG. 12B in the conductivity type of semiconductor regions directly below the sidewall insulator 306a and the sidewall insulator 306b. The semiconductor regions directly below the sidewall insulator 306a and the sidewall insulator 306b are regions having $n^+$ conductivity type in the transistor illustrated in FIG. 12A but are intrinsic semiconductor regions in the transistor illustrated in FIG. 12B. In other words, in the semiconductor layer of FIG. 12B, a region having a width of $L_{off}$ which overlaps with neither the semiconductor region 303a (the semiconductor region 303c) nor the gate 305 is provided. This region is called an offset region, and the width $L_{off}$ is called an offset length. The offset length is equal to the width of the sidewall insulator 306a (the sidewall insulator 306b).

Figure 9A:
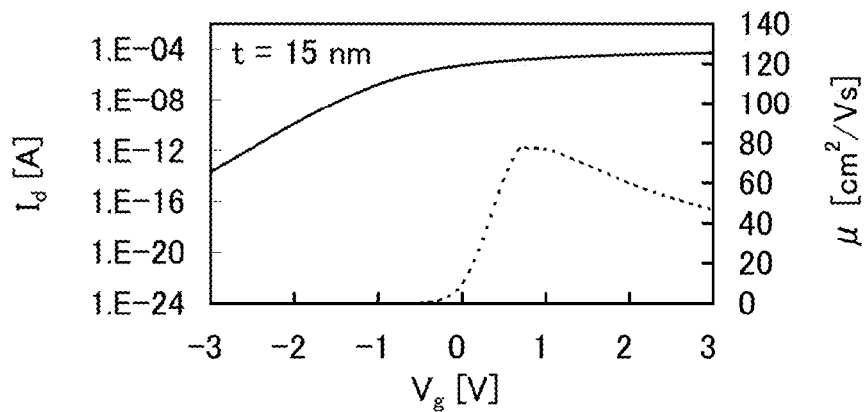
FIGS. 9A to 9C are graphs each showing dependence of drain current and mobility on gate voltage obtained by calculation.
Figure 9B:
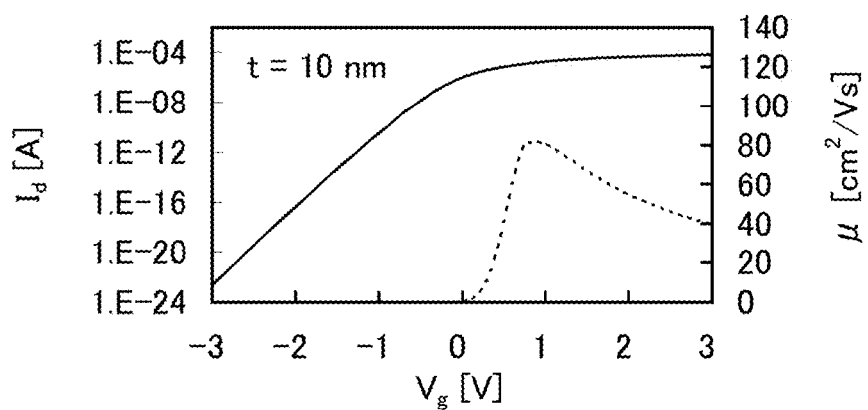
Figure 9C:
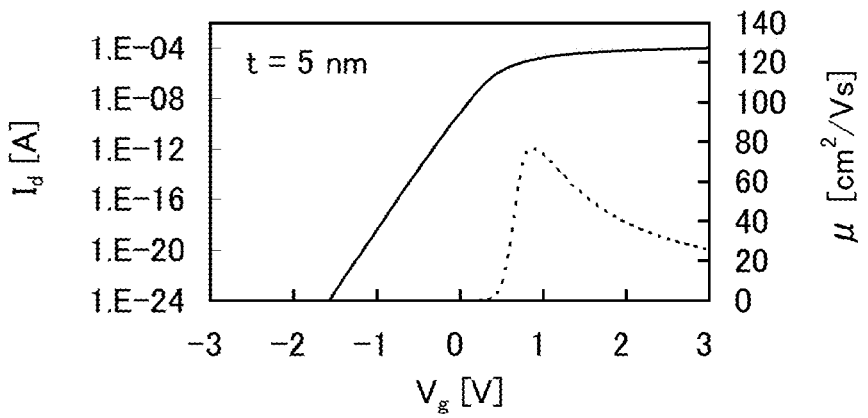

The other parameters used in calculation are as described above. For the calculation, device simulation software Sentaurus Device manufactured by Synopsys, Inc. was used. FIGS. 9A to 9C show the gate voltage ($V_g$: a potential difference obtained by subtracting the potential of the source from that of the gate) dependence of the drain current ($I_d$, a solid line) and the mobility (μ, a dotted line) of the transistor having the structure illustrated in FIG. 12A. The drain current $I_d$ is obtained by calculation under the assumption that the drain voltage ($V_d$: a potential difference obtained by subtracting the potential of the source from that of the drain) is +1 V, and the mobility μ is obtained by calculation under the assumption that the drain voltage is +0.1 V.

FIG. 9A shows the gate voltage dependence of the transistor in the case where the thickness of the gate insulating film is 15 nm, FIG. 9B shows that of the transistor in the case where the thickness of the gate insulating film is 10 nm, and FIG. 9C shows that of the transistor in the case where the thickness of the gate insulating film is 5 nm As the gate insulating film is thinner, the drain current $I_d$ (off-state current) particularly in an off state is significantly decreased. In contrast, there is no noticeable change in the peak value of the mobility μ and the drain current $I_d$ (on-state current) in an on state.

FIGS. 10A to 10C show the gate voltage $V_g$ dependence of the drain current $I_d$ (a solid line) and the mobility μ (a dotted line) of the transistor having the structure in FIG. 12B and an offset length $L_{off}$ of 5 nm. The drain current $I_d$ is obtained by calculation under the assumption that the drain voltage is +1 V and the mobility μ is obtained by calculation under the assumption that the drain voltage is +0.1 V. FIG. 10A shows the gate voltage dependence of the transistor in the case where the thickness of the gate insulating film is 15 nm, FIG. 10B shows that of the transistor in the case where the thickness of the gate insulating film is 10 nm, and FIG. 10C shows that of the transistor in the case where the thickness of the gate insulating film is 5 nm Further, FIGS. 11A to 11C show the gate voltage $V_g$ dependence of the drain current $I_d$ (a solid line) and the mobility μ (a dotted line) of the transistor having the structure illustrated in FIG. 12B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 11A shows the gate voltage $V_g$ dependence of the transistor in the case where the thickness of the gate insulating film is 15 nm, FIG. 11B shows that of the transistor in the case where the thickness of the gate insulating film is 10 nm, and FIG. 11C shows that of the transistor in the case where the thickness of the gate insulating film is 5 nm In either of the structures, as the gate insulating film is thinner, the off-state current is significantly decreased, whereas no noticeable change arises in the peak value of the mobility μ and the on-state current.

Note that the peak of the mobility μ is approximately 80 $cm^2/Vs$ in FIGS. 9A to 9C, approximately 60 $cm^2/Vs$ in FIGS. 10A to 10C, and approximately 40 $cm^2/Vs$ in FIGS. 11A to 11C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current.

As described above, the oxide semiconductor transistor including an oxide semiconductor can have significantly high mobility.

Note that the transistor described in this embodiment as an oxide semiconductor transistor is a mere example, and without limitation thereto, a variety of modes can be employed for the oxide semiconductor transistor.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 13A:
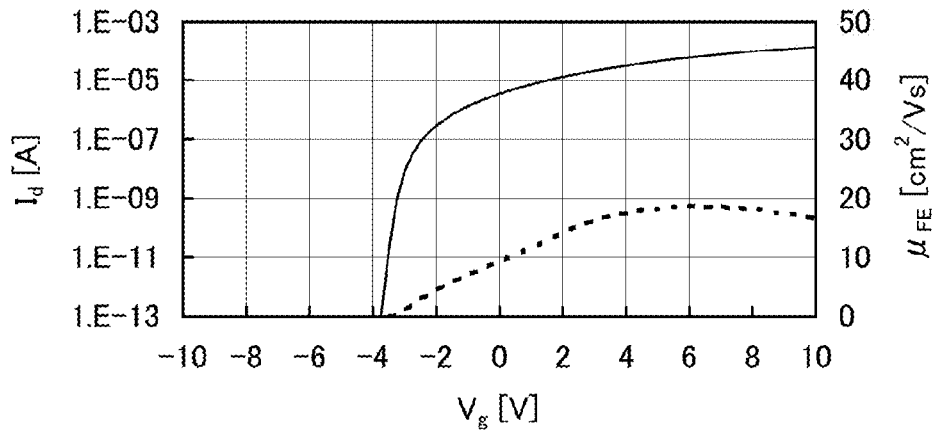
FIGS. 13A to 13C are graphs each showing characteristics of a transistor including an oxide semiconductor film.
Figure 13B:
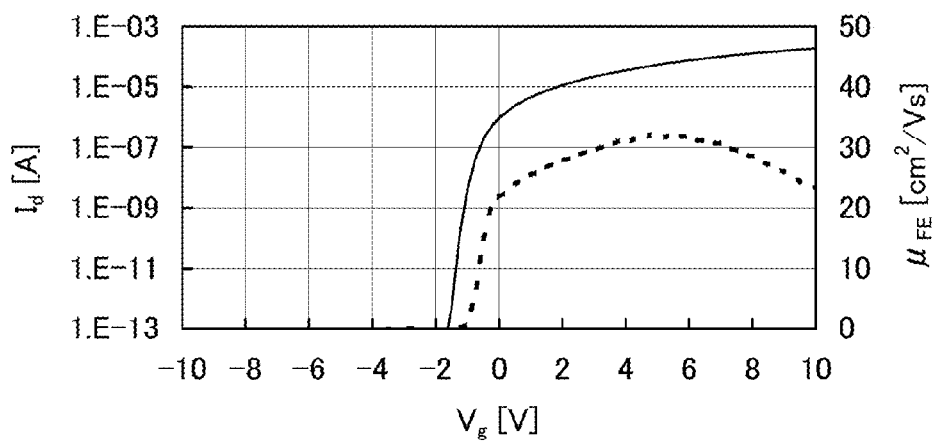
Figure 13C:
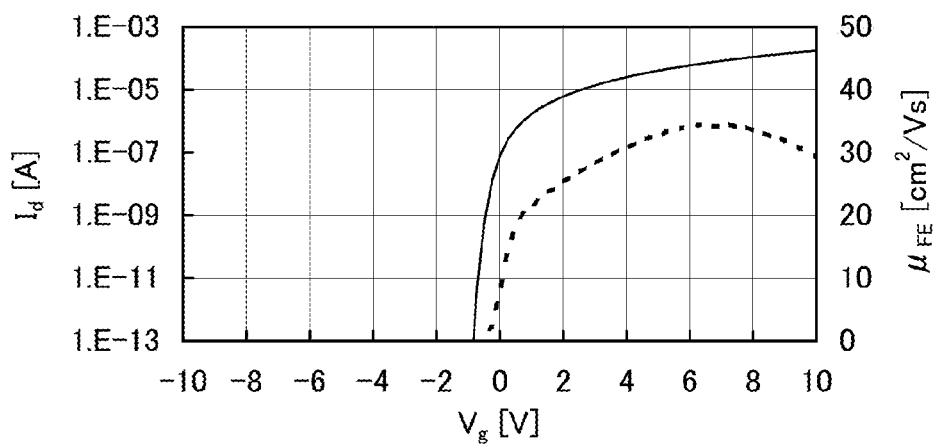

As an example, FIGS. 13A to 13C each show characteristics of a transistor in which an oxide semiconductor film including In, Sn, and Zn as main components and having a channel length L of 3 μm and a channel width W of 10 μm, and a gate insulating film with a thickness of 100 nm are used. Note that $V_d$ was set to 10 V.

FIG. 13A shows characteristics of a transistor whose oxide semiconductor film including In, Sn, and Zn as main components was formed by a sputtering method without heating a substrate intentionally. The field-effect mobility of the transistor is 18.8 $cm^2/Vsec$. On the other hand, when the oxide semiconductor film including In, Sn, and Zn as main components is formed while heating the substrate intentionally, the field-effect mobility can be improved. FIG. 13B shows characteristics of a transistor whose oxide semiconductor film including In, Sn, and Zn as main components was formed while heating a substrate at 200° C. The field-effect mobility of the transistor is 32.2 $cm^2/Vsec$.

The field-effect mobility can be further improved by performing heat treatment after formation of the oxide semiconductor film including In, Sn, and Zn as main components. FIG. 13C shows characteristics of a transistor whose oxide semiconductor film including In, Sn, and Zn as main components was formed by a sputtering method at 200° C. and then subjected to heat treatment at 650° C. The field-effect mobility of the transistor is 34.5 cm²/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 cm²/Vsec is expected to be realized.

The oxide semiconductor including In, Sn, and Zn as main components may be crystallized in the following manner oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 13A and 13B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at high temperature, the transistor can be normally off By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of 20 V was applied so that the intensity of an electric field applied to gate insulating films was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $-20$ V of $V_g$ was applied so that the intensity of an electric field applied to the gate insulating films was $-2$ MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 14A:
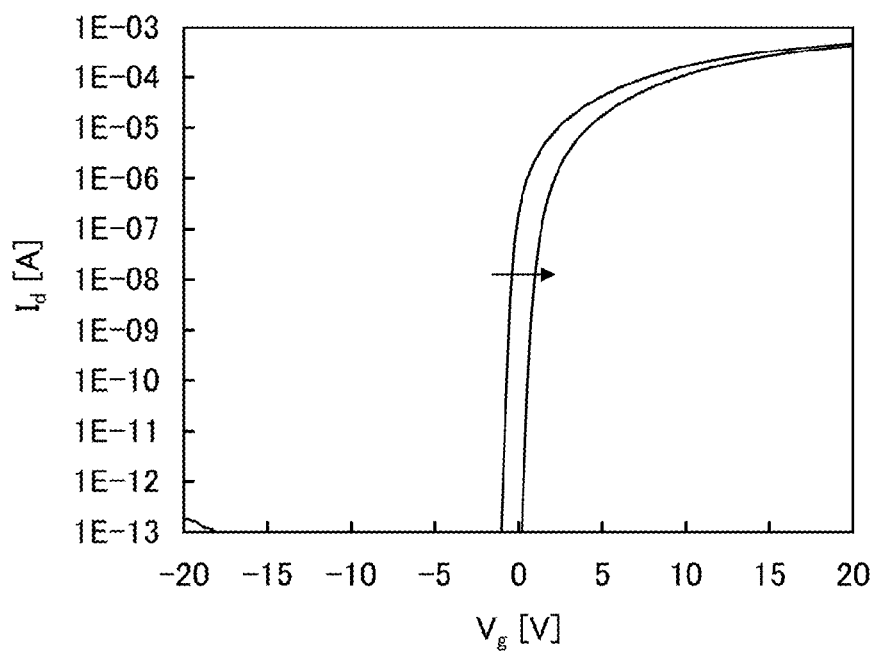
FIGS. 14A and 14B are graphs each showing $V_g$-$I_d$ characteristics of a transistor of Sample 1 after a BT test.
Figure 14B:
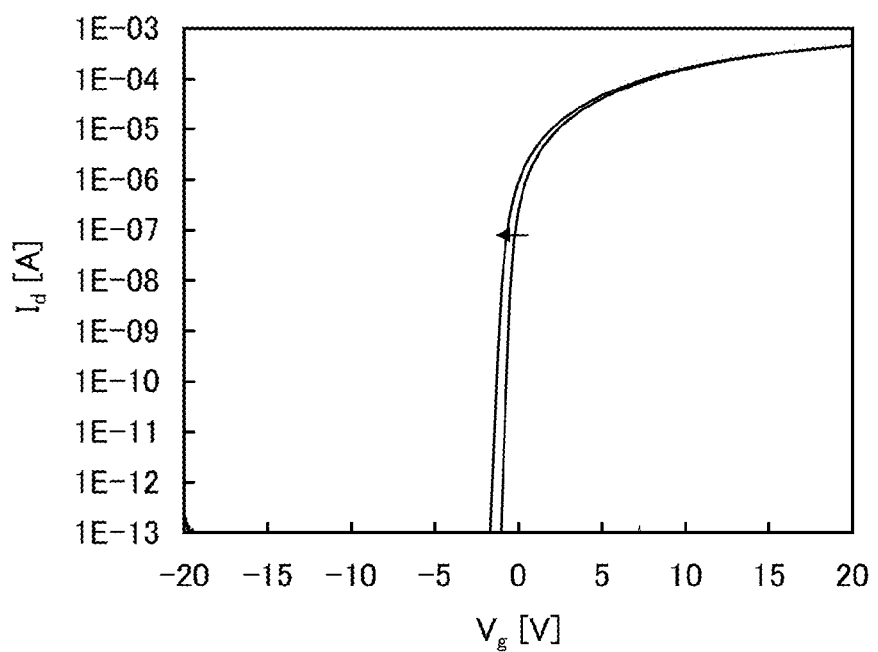
Figure 15A:
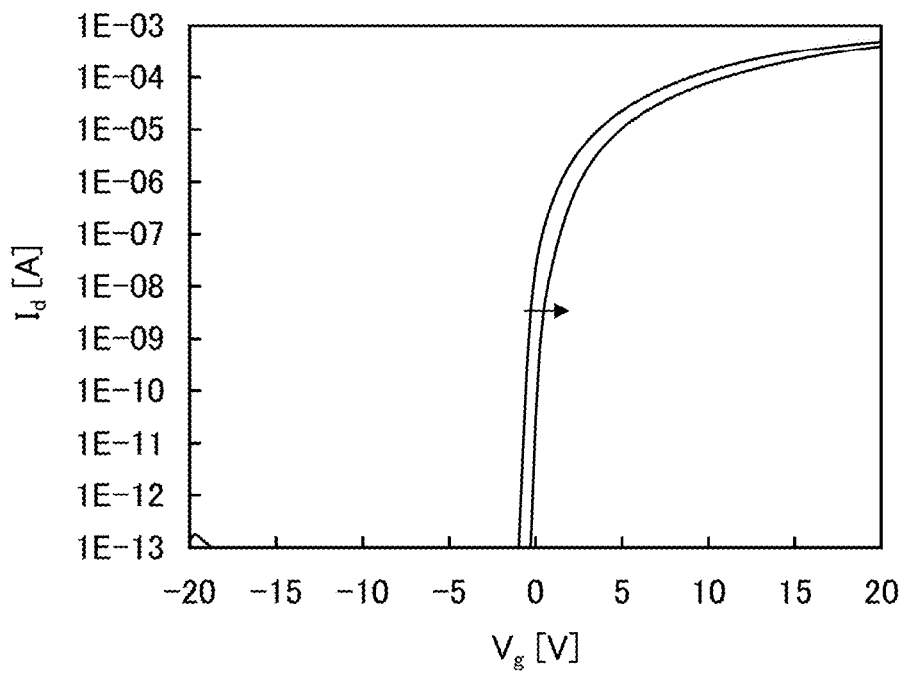
FIGS. 15A and 15B are graphs each showing $V_g$-$I_d$ characteristics of a transistor of Sample 2 after a BT test.
Figure 15B:
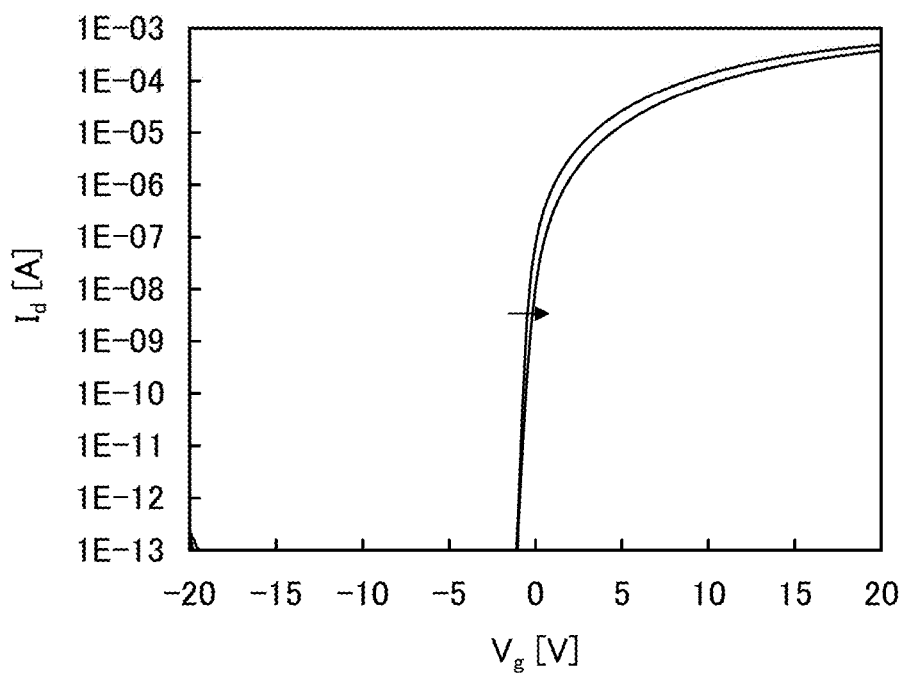

FIGS. 14A and 14B show a result of the positive BT test of Sample 1 and a result of the negative BT test of Sample 1, respectively. FIGS. 15A and 15B show a result of the positive BT test of Sample 2 and a result of the negative BT test of Sample 2, respectively.

The amount of shift in the threshold voltage of Sample 1 due to the positive BT test and that due to the negative BT test were 1.80 V and $-0.42$ V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an atmosphere including oxygen; alternatively, dehydration or dehydrogenation by heat treatment in an atmosphere including nitrogen or an inert gas or under reduced pressure may be performed first, and then oxygen may be supplied to the oxide semiconductor by heat treatment in an atmosphere including oxygen. Oxygen is supplied to the oxide semiconductor after dehydration or dehydrogenation, whereby an effect of the heat treatment can be further increased. As a method for supplying oxygen after the heat treatment, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1\times10^{16}$/cm³ and lower than or equal to $2\times10^{20}$/cm³, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 18:
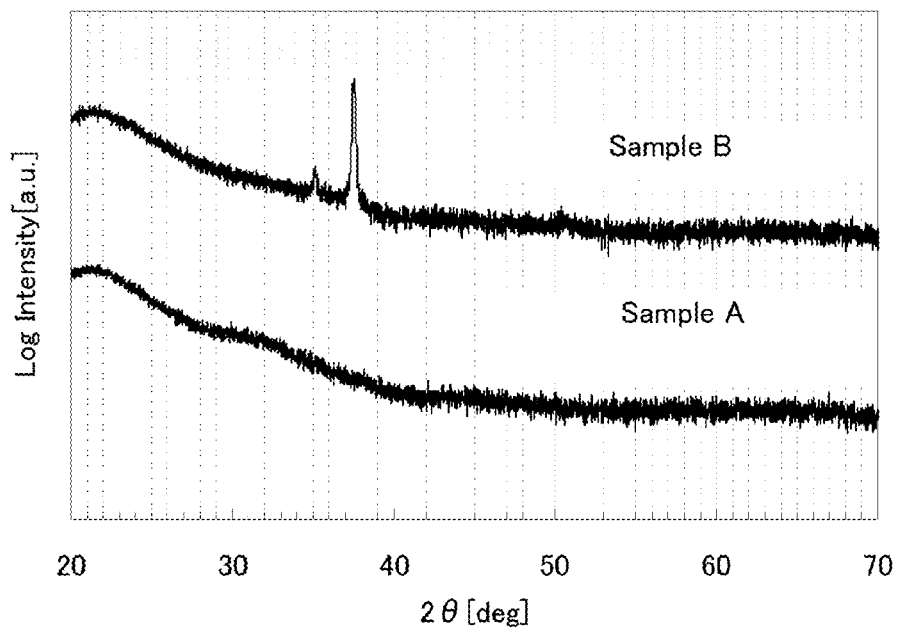
FIG. 18 shows XRD spectra of Sample A and Sample B.

FIG. 18 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 19:
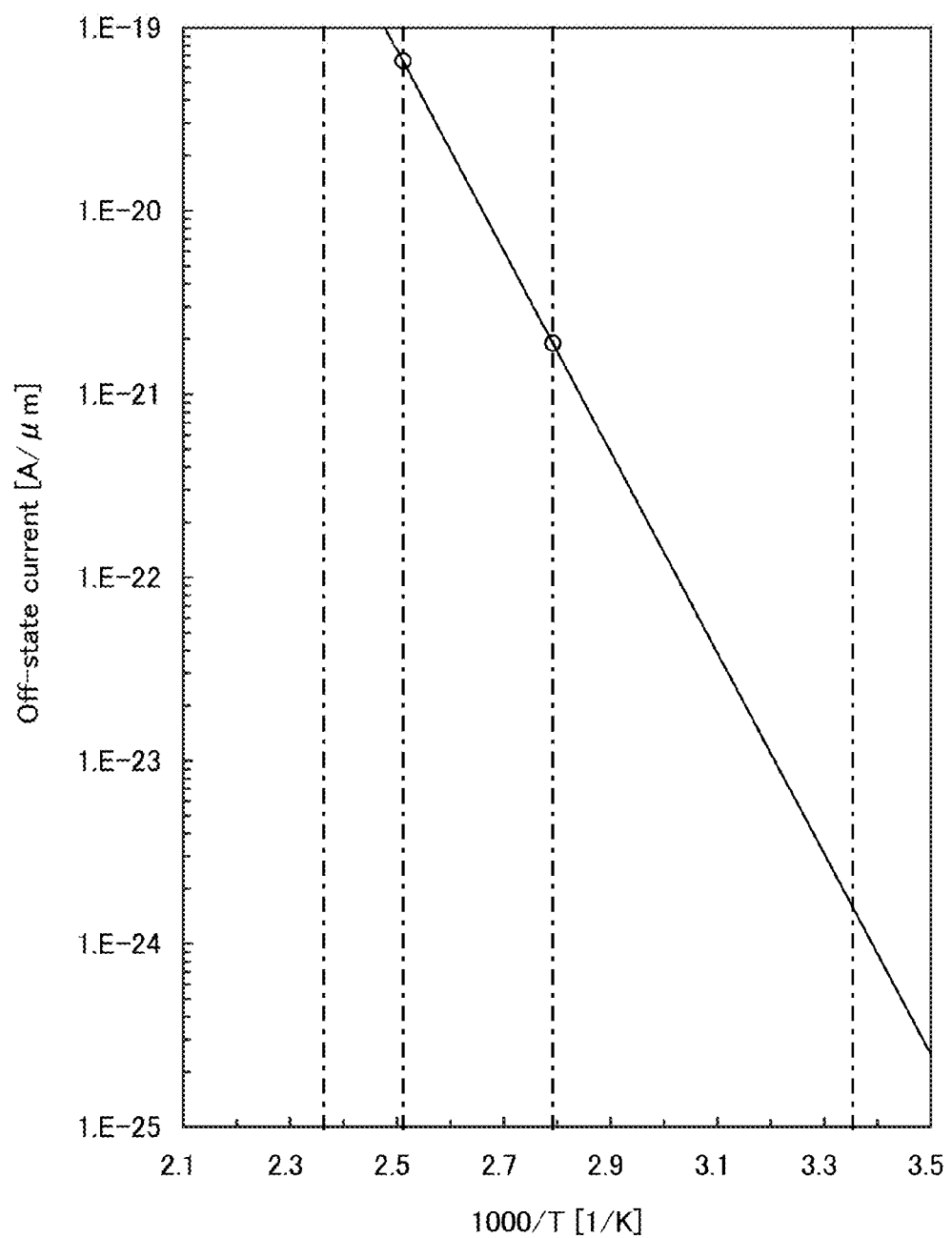
FIG. 19 shows a relation between off-state current of a transistor and substrate temperature in measurement.

FIG. 19 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 19, the off-state current was 0.1 aA/μm ($1\times10^{-19}$ A/μm) or smaller and 10 zA/μm ($1\times10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1\times10^{-22}$ A/μm) or smaller. Hence, the off-state current can be 1 aA/μm ($1\times10^{-18}$ A/μm) or smaller, 100 zA/μm ($1\times10^{-19}$ A/μm) or smaller, and 1 zA/μm ($1\times10^{-21}$ A/μm) or smaller at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of the sample, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes in a channel length direction is referred to as Lov, and the width of a portion of the pair of electrodes, which does not overlap with an oxide semiconductor film, in a channel width direction is referred to as dW.

Figure 16:
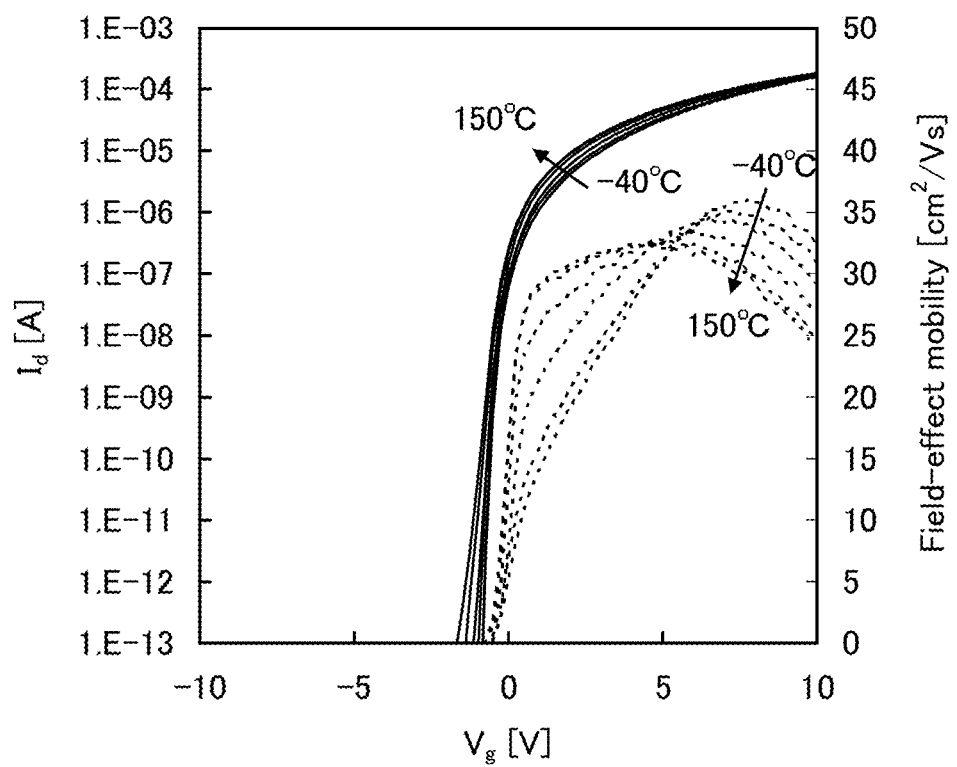
FIG. 16 is a graph showing $V_g$ dependence of $I_d$ and field-effect mobility.
Figure 17A:
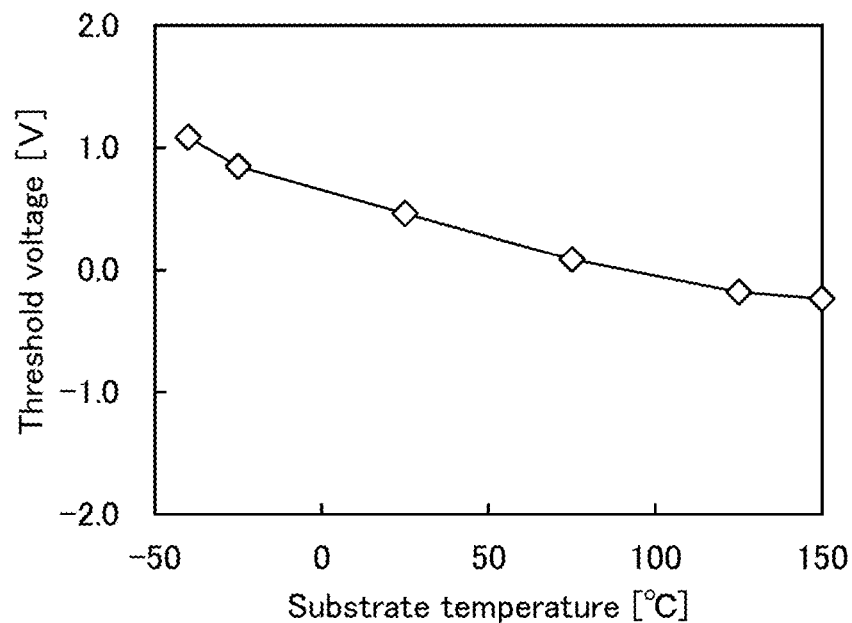
FIG. 17A shows a relation between substrate temperature and threshold voltage and FIG. 17B shows a relation between substrate temperature and field-effect mobility.

FIG. 16 shows the $V_g$ dependence of $I_d$ (a solid line) and field-effect mobility (a dotted line). FIG. 17A shows a relation between the substrate temperature and the threshold voltage, and FIG. 17B shows a relation between the substrate temperature and the field-effect mobility.

From FIG. 17A, it is found that the threshold voltage gets lower as the substrate temperature increases. Note that the threshold voltage is decreased from 1.09 V to −0.23 V in the range from −40° C. to 150° C.

Figure 17B:
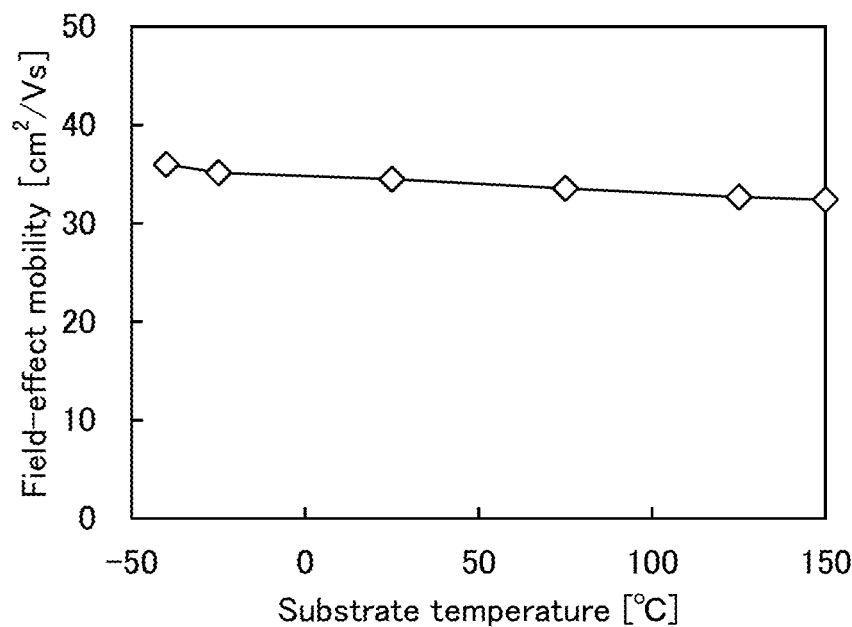

From FIG. 17B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor.

EXPLANATION OF REFERENCE

100: semiconductor device, 102: control circuit, 104: CPU, 106: timer, 108: monitor circuit, 110: EN signal control circuit, 112: method storage memory element, 114: interface, 116: data storage memory element, 118: flip-flop circuit, 120: logic circuit, 122: portion, 152: first transmission gate, 154:

first clocked inverter circuit, 156: second clocked inverter circuit, 158: second transmission gate, 160: inverter circuit, 162: third clocked inverter circuit, 164: transistor, 166: capacitor, 200: semiconductor substrate provided with p-channel transistor and n-channel transistor, 201: high-concentration impurity region, 202: low-concentration impurity region, 203: gate insulating film, 204: gate electrode, 205: interlayer insulating film, 210: transistor having channel formation region in oxide semiconductor layer, 211: oxide semiconductor layer, 212a: source electrode, 212b: drain electrode, 213: gate insulating film, 214a: electrode, 214b: gate electrode, 301: base insulating film, 302: embedded insulating film, 303a: semiconductor region, 303b: semiconductor region, 303c: semiconductor region, 304: gate insulating film, 305: gate, 306a: sidewall insulator, 306b: sidewall insulator, 307: insulating film, 308a: source, and 308b: drain.

This application is based on Japanese Patent Application serial no. 2011-108623 filed with Japan Patent Office on May 13, 2011, the entire contents of which are hereby incorporated by reference.

The invention claimed is:

1. A semiconductor device comprising:
   a control circuit; and
   a processing unit,
   wherein the control circuit comprises:
     a first circuit;
     a second circuit; and
     a first memory element,
   wherein the processing unit comprises:
     a plurality of second memory elements; and
     a plurality of flip-flop circuits,
   wherein the first circuit counts the number of times of turning on and off the second circuit,
   wherein the second circuit generates a signal input to the plurality of second memory elements and the plurality of flip-flop circuits,
   wherein in the case where the counted number is higher than or equal to a threshold value, a first data including a first method for storing the signal in the second memory elements and the flip-flop circuits is stored in the first memory element, and in the case where the counted number is lower than the threshold value, a second data including a second method for storing the signal in the second memory elements and the flip-flop circuits is stored in the first memory element, and
   wherein the plurality of second memory elements each include a capacitor of which one electrode is electrically connected to a power supply line and a transistor of which one of a source and a drain is electrically connected to the other electrode of the capacitor.

2. The semiconductor device according to claim 1, wherein the processing unit is a central processing unit.

3. The semiconductor device according to claim 1, wherein an off-state current per micrometer in channel width of the transistor is less than or equal to 10 aA/µm.

4. The semiconductor device according to claim 1,
   wherein the first method is a constant storage method, and
   wherein the second method is an end storage method.

5. The semiconductor device according to claim 1, wherein the transistor comprises an oxide semiconductor.

6. The semiconductor device according to claim 1, wherein the control circuit and the processing unit are formed over a same substrate.

7. A semiconductor device comprising:
   a control circuit; and
   a processing unit,
   wherein the control circuit comprises:
     a first circuit;
     a second circuit;
     a first memory element;
     a timer; and
     an interface,
   wherein the processing unit comprises:
     a plurality of second memory elements; and
     a plurality of flip-flop circuits,
   wherein the first circuit counts the number of times of turning on and off the second circuit,
   wherein the second circuit generates a signal input to the plurality of second memory elements and the plurality of flip-flop circuits,
   wherein in the case where the counted number is higher than or equal to a threshold value, a first data including a first method for storing the signal in the second memory elements and the flip-flop circuits is stored in the first memory element, and in the case where the counted number is lower than the threshold value, a second data including a second method for storing the signal in the second memory elements and the flip-flop circuits is stored in the first memory element, and
   wherein the plurality of second memory elements each include a capacitor of which one electrode is electrically connected to a power supply line and a transistor of which one of a source and a drain is electrically connected to the other electrode of the capacitor.

8. The semiconductor device according to claim 7, wherein the processing unit is a central processing unit.

9. The semiconductor device according to claim 7, wherein an off-state current per micrometer in channel width of the transistor is less than or equal to 10 aA/µm.

10. The semiconductor device according to claim 7,
    wherein the first method is a constant storage method, and
    wherein the second method is an end storage method.

11. The semiconductor device according to claim 7, wherein the transistor comprises an oxide semiconductor.

12. The semiconductor device according to claim 7, wherein the control circuit and the processing unit are formed over a same substrate.

13. A semiconductor device comprising:
    a control circuit; and
    a processing unit,
    wherein the control circuit comprises:
      a first circuit;
      a second circuit;
      a first memory element; and
      a logic circuit,
    wherein the processing unit comprises:
      a plurality of second memory elements; and
      a plurality of flip-flop circuits,
    wherein the first circuit counts the number of times of turning on and off the second circuit,
    wherein the second circuit generates a signal input to the plurality of second memory elements and the plurality of flip-flop circuits,
    wherein in the case where the counted number is higher than or equal to a threshold value, a first data including a first method for storing the signal in the second memory elements and the flip-flop circuits is stored in the first memory element, and in the case where the counted number is lower than the threshold value, a second data including a second method for storing the signal in the second memory elements and the flip-flop circuits is stored in the first memory element, and
    wherein the plurality of second memory elements each include a capacitor of which one electrode is electrically connected to a power supply line and a transistor of which one of a source and a drain is electrically connected to the other electrode of the capacitor.

14. The semiconductor device according to claim 13, wherein the processing unit is a central processing unit.

15. The semiconductor device according to claim 13, wherein an off-state current per micrometer in channel width of the transistor is less than or equal to 10 aA/μm.

16. The semiconductor device according to claim 13, wherein the first method is a constant storage method, and wherein the second method is an end storage method.

17. The semiconductor device according to claim 13, wherein the transistor comprises an oxide semiconductor.

18. The semiconductor device according to claim 13, wherein the control circuit and the processing unit are formed over a same substrate.

\* \* \* \* \*